United States Patent
Yoon et al.

(10) Patent No.: US 12,550,549 B2
(45) Date of Patent: Feb. 10, 2026

(54) DISPLAY PANEL

(71) Applicant: Samsung Display Co., Ltd., Yongin-Si (KR)

(72) Inventors: Young Soo Yoon, Seoul (KR); Dae Suk Kim, Seongnam-si (KR); Yang Hee Kim, Hwaseong-si (KR); Hyun Chol Bang, Seongnam-si (KR); Il Goo Youn, Asan-si (KR); Bong Won Lee, Seoul (KR); So Young Lee, Asan-si (KR); Su Kyo Jung, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 751 days.

(21) Appl. No.: 17/888,673

(22) Filed: Aug. 16, 2022

(65) Prior Publication Data
US 2023/0240103 A1 Jul. 27, 2023

(30) Foreign Application Priority Data
Jan. 26, 2022 (KR) .................. 10-2022-0011528

(51) Int. Cl.
*H10K 59/131* (2023.01)
*H10K 59/35* (2023.01)
*H10K 59/40* (2023.01)

(52) U.S. Cl.
CPC ......... *H10K 59/131* (2023.02); *H10K 59/353* (2023.02); *H10K 59/40* (2023.02)

(58) Field of Classification Search
CPC .... H10K 59/131; H10K 59/353; H10K 59/40; H10K 50/844; H10K 59/121; H10K 59/124
See application file for complete search history.

(56) References Cited

U.S. PATENT DOCUMENTS

| | | | |
|---|---|---|---|
| 11,316,001 B2 | 4/2022 | Cho et al. | |
| 11,392,230 B2 | 7/2022 | Lee et al. | |
| 11,580,914 B2 | 2/2023 | Cho et al. | |
| 11,744,126 B2 | 8/2023 | Cho et al. | |
| 12,217,706 B2 | 2/2025 | Cho et al. | |
| 2018/0233550 A1* | 8/2018 | Han | H10K 59/131 |
| 2021/0005697 A1* | 1/2021 | Kang | H10K 59/1315 |
| 2022/0052147 A1* | 2/2022 | Liu | H10K 59/352 |
| 2022/0302219 A1* | 9/2022 | Li | H10K 59/353 |

(Continued)

FOREIGN PATENT DOCUMENTS

| | | |
|---|---|---|
| KR | 2020-0000840 A | 1/2020 |
| KR | 2020-0026381 A | 3/2020 |

(Continued)

*Primary Examiner* — Yara B Green
*Assistant Examiner* — Akhee Sarker-Nag
(74) *Attorney, Agent, or Firm* — Innovation Counsel LLP

(57) ABSTRACT

A display panel comprises a first data line, a second data line electrically insulated from the first data line, and a first data connection line electrically connected to the first data line and disposed closer to the second data line than to the first data line in a first direction. The first data line, the second data line, and the first data connection line each comprise a line member extending in a second direction different from the first direction and comprise a first protrusion and a second protrusion both protruding from the line member and being wider than the line member in the first direction.

20 Claims, 25 Drawing Sheets

(56) References Cited

U.S. PATENT DOCUMENTS

| | | | | |
|---|---|---|---|---|
| 2022/0399427 A1* | 12/2022 | Shang | ............ | H10K 59/131 |
| 2023/0247870 A1* | 8/2023 | Choi | ............ | G06F 3/04164 |
| | | | | 257/40 |
| 2024/0038165 A1* | 2/2024 | Liu | ............ | G09G 3/3266 |
| 2025/0182706 A1 | 6/2025 | Cho et al. | | |

FOREIGN PATENT DOCUMENTS

| | | | |
|---|---|---|---|
| KR | 10-2021-0010686 A | 1/2021 | |
| KR | 2021-0033586 A | 3/2021 | |
| KR | 10-2021-0054654 A | 5/2021 | |
| KR | 10-2021-0148547 A | 12/2021 | |

* cited by examiner

FIG. 16
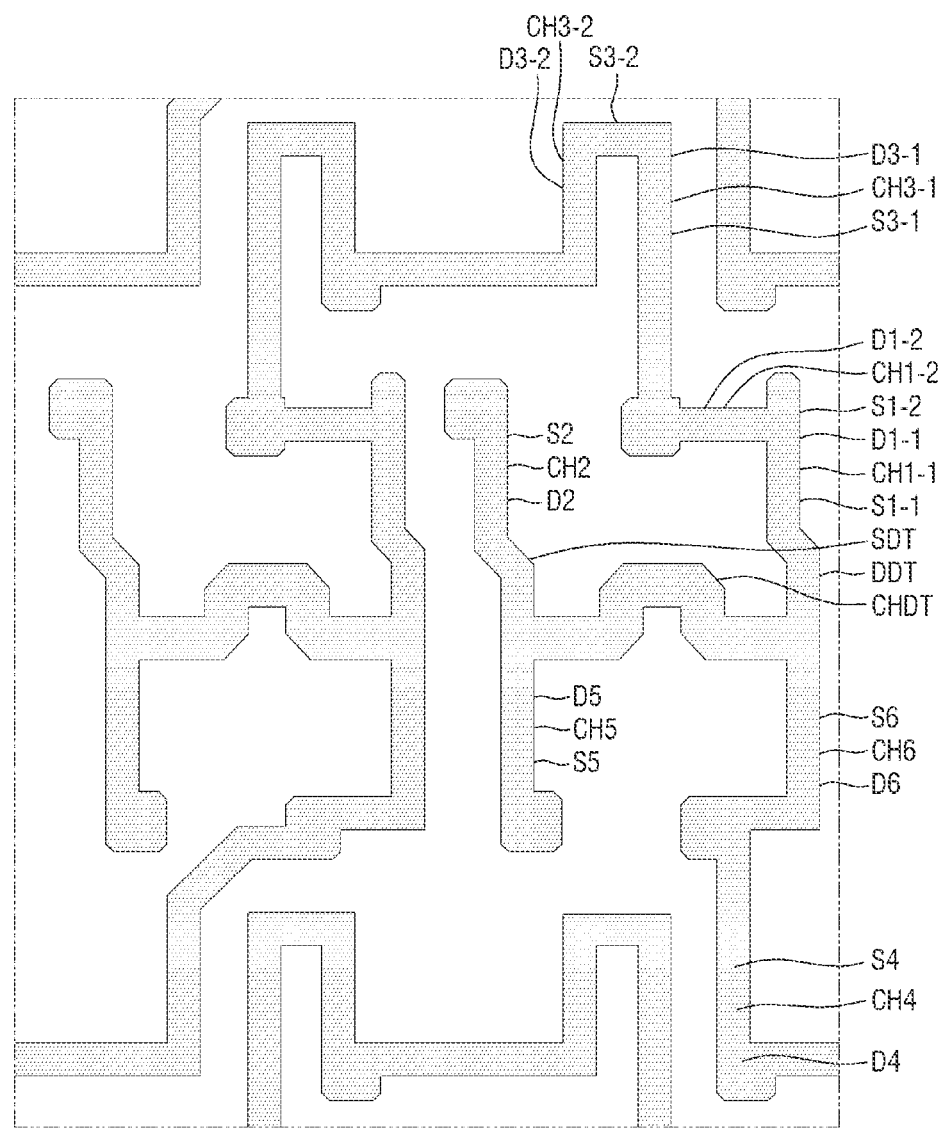
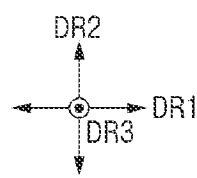

GTP1: SL, ICL, ECL, GCL, GDT, G1-1, G1-2, G2, G3-1, G3-2, G4, G5, G6

GTP2: SHE, HPSL1, HVGIL, HVAIL

SDP1: VPSL1, VVGIL, VVAIL, CE1, CE2, CE3

DISPLAY PANEL

CROSS-REFERENCE TO RELATED APPLICATION

This application claims priority to Korean Patent Application No. 10-2022-0011528 filed on Jan. 26, 2022 in the Korean Intellectual Property Office; the Korean Patent Application is incorporated by reference.

BACKGROUND

1. Technical Field

The technical field relates to a display panel.

2. Description of the Related Art

A display device may display images in response to input signals. Display devices are included in various electronic devices, such as smartphones, digital cameras, laptop computers, navigation devices, and smart televisions.

A display device may include a display panel for emitting light to display images and may include a driver for supplying signals and/or power for driving the display panel.

The display panel may include a display area that accommodates pixels and signal lines connected to the pixels. The display panel may include a non-display area that accommodates the driver and fan-out lines that connect the driver to the signal lines.

In general, it is desirable to minimize the non-display area and to maximize the resolution of the display panel.

SUMMARY

Embodiments may be related a display panel with a minimum width of a non-display area and satisfactory resolution.

According to an embodiment, a display panel comprises a substrate comprising a display area in which a plurality of pixel areas each emitting light for image display are arranged, a plurality of first data lines disposed on a portion of the display area, a plurality of second data lines disposed on another portion of the display area, and a plurality of first data connection lines extending in the same direction as the plurality of second data lines, corresponding to each of the plurality of first data lines, and neighboring each of the plurality of second data lines. The plurality of first data lines, the plurality of second data lines, and the plurality of first data connection lines are disposed on the same layer. The plurality of first data lines, the plurality of second data lines, and the plurality of first data connection lines are each disposed in a form comprising a line pattern portion extending in a predetermined direction, and a first protrusion and a second protrusion which are connected to the line pattern portion, correspond to each of the neighboring pixel areas and each has a width wider than the line pattern portion. Some of the first protrusions comprised in the plurality of first data lines, the plurality of second data lines, and the plurality of first data connection lines, corresponding to pixel areas parallel to each other in a first direction crossing the predetermined direction, are arranged parallel to each other in the first direction. Some of the second protrusions comprised in the plurality of first data lines, the plurality of second data lines, and the plurality of first data connection lines, corresponding to the pixel areas parallel to the first direction, are arranged parallel to each other in the first direction.

The display panel further comprises a plurality of second data connection lines disposed on a different layer than the plurality of first data lines, the plurality of second data lines, and the plurality of first data connection lines, extending in the first direction, and corresponding to each of the plurality of first data lines.

The display panel further comprises a plurality of first fan-out lines disposed in a non-display area surrounding the display area and respectively corresponding to the plurality of first data lines, and a plurality of second fan-out lines disposed in the non-display area and respectively corresponding to the plurality of second data lines. The plurality of first data lines is respectively connected to the plurality of first fan-out lines through the plurality of first data connection lines and the plurality of second data connection lines. The plurality of second data lines is directly connected to the plurality of second fan-out lines, respectively.

Any one of the plurality of first data lines is connected to any one pixel area through a transistor contact hole overlapping one of the first protrusion and the second protrusion corresponding to the any one pixel area adjacent to the any one of the plurality of first data lines. The any one of the first data lines is connected to any one of the second data connection lines corresponding to the any one of the first data lines through a first line contact hole overlapping the other one of the first protrusion and the second protrusion corresponding to the any one pixel area adjacent to the any one of the plurality of first data lines. Any one of the first data connection lines corresponding to the any one of the first data lines is connected to the any one of the second data connection lines through a second line contact hole overlapping any one of the first protrusion and the second protrusion corresponding to the any one pixel area adjacent to the any one of the first data connection lines.

The display panel further comprises a plurality of first dummy line patterns disposed on the same layer as the plurality of first data connection lines, extending in a second direction crossing the first direction, and each spaced apart and lined up on at least one side of each of the plurality of first data connection lines in the second direction. Each of the plurality of first dummy line patterns has a shape comprising the line pattern portion, the first protrusion, and the second protrusion. The line pattern portion of each of the plurality of first data lines, the plurality of second data lines, the plurality of first data connection lines, and the plurality of first dummy line patterns extends in the second direction.

The display panel further comprises a plurality of second dummy line patterns disposed on the same layer as the plurality of second data connection lines, extending in the first direction, and spaced apart and lined up on at least one side of each of the plurality of second data connection lines in the first direction, a plurality of first power supply lines disposed on the same layer as the plurality of second data connection lines, extending in the first direction, alternating with the plurality of second data connection lines or the plurality of second dummy line patterns in the second direction, and supplying a first power, and a plurality of second power supply lines disposed on the same layer as the plurality of first data lines, extending in the second direction, and supplying a second power lower than the first power. Each of the plurality of second power supply lines has a shape comprising the line pattern portion, the first protrusion, and the second protrusion. Some of the second power supply lines are adjacent to the first data lines, respectively.

The first data line and the second power supply line neighboring each other have line symmetry with each other.

Any one of the plurality of second data lines has line symmetry with the first data connection line or the first dummy line pattern adjacent to the any one of the plurality of second data lines.

The display panel further comprises a third data lines disposed in another portion of the display area and respectively adjacent to some other ones of the second power supply lines. Each of the plurality of third data lines has a shape comprising the line pattern portion, the first protrusion, and the second protrusion. The third data line and the second power supply line neighboring each other have line symmetry with each other.

Any one of the plurality of first dummy line patterns is connected to any one of the second dummy line patterns through a first power contact hole overlapping one of the first protrusion and the second protrusion corresponding to any one pixel area adjacent to the any one of the plurality of first dummy line patterns. Any one of the plurality of second power supply lines is connected to any one of the second dummy line patterns through a second power contact hole overlapping one of the first protrusion and the second protrusion corresponding to any one pixel area adjacent to the any one of the plurality of second power supply lines.

A portion of the entire first protrusion and the entire second protrusion corresponding to the plurality of first data lines, the plurality of second data lines, the plurality of first data connection lines, the plurality of first dummy line patterns, and the plurality of second power supply lines corresponds to any one of the first line contact hole, the second line contact hole, the transistor contact hole, the first power contact hole, and the second power contact hole, respectively. The other remaining portion of the entire first protrusion and the entire second protrusion is disposed to be flat.

The display panel further comprises a semiconductor pattern layer disposed on the substrate, a first gate pattern layer disposed on a first gate insulating layer covering the semiconductor pattern layer, a second gate pattern layer disposed on a second gate insulating layer covering the first gate pattern layer, a first source/drain pattern layer disposed on an interlayer insulating layer covering the second gate pattern layer, a second source/drain pattern layer disposed on a first planarization layer covering the first source/drain pattern layer, a third source/drain pattern layer disposed on a second planarization layer covering the second source/drain pattern layer, and a third planarization layer covering the third source/drain pattern layer. The second source/drain pattern layer comprises the plurality of second data connection lines, the plurality of second dummy line patterns, and the plurality of first power supply lines. The third source/drain pattern layer comprises the plurality of first data lines, the plurality of second data lines, the plurality of first data connection lines, the plurality of first dummy line patterns, and the plurality of second power supply lines.

The display panel further comprises a light emitting array layer disposed on the third planarization layer and comprising a plurality of light emitting elements respectively corresponding to the plurality of pixel areas, and an encapsulation structure layer covering the light emitting array layer.

The plurality of pixel areas comprises a first pixel area, a second pixel area, and a third pixel area corresponding to different colors. A first light emitting element corresponding to the first pixel area and a second light emitting element corresponding to the second pixel area alternate in the first direction or the second direction. A third light emitting element corresponding to the third pixel area is spaced apart from each of the first light emitting element and the second light emitting element in a diagonal direction crossing the first direction and the second direction. The first light emitting element overlaps a pair of first protrusions neighboring each other and a pair of second protrusions neighboring each other. The second light emitting element overlaps another pair of first protrusions neighboring each other and another pair of second protrusions neighboring each other. The third light emitting element overlaps a portion of the line pattern portion.

One of the first pixel area and the second pixel area emits light in a wavelength range corresponding to red and the other one emits light in a wavelength range corresponding to blue. The third pixel area emits light in a wavelength range corresponding to green.

An arrangement form of the first, second and third light emitting elements includes a first column in which the first light emitting element and the second light emitting element are alternately arranged in the first direction, and a second column in which the third light emitting elements are arranged in a line in the first direction. The first column and the second column are alternated in the second direction.

The plurality of pixel areas comprises a first pixel area, a second pixel area, and a third pixel area corresponding to different colors. A first light emitting element corresponding to the first pixel area and a second light emitting element corresponding to the second pixel area alternate in the first direction or the second direction. A third light emitting element corresponding to the third pixel area is spaced apart from each of the first light emitting element and the second light emitting element in a diagonal direction crossing the first direction and the second direction. The first light emitting element and the second light emitting element overlap different portions of the line pattern portion, respectively. The third light emitting element overlaps a pair of first protrusions neighboring each other and a pair of second protrusions neighboring each other.

One of the first pixel area and the second pixel area emits light in a wavelength range corresponding to red and the other one emits light in a wavelength range corresponding to blue. The third pixel area emits light in a wavelength range corresponding to green.

An arrangement form of the first, second and third light emitting elements includes a first column in which the first light emitting element and the second light emitting element are alternately arranged in the first direction, and a second column in which the third light emitting elements are arranged in a line in the first direction. The first column and the second column are alternated in the second direction.

Each of the plurality of first data lines and the plurality of second data lines is connected to the respective neighboring pixel areas through transistor contact holes overlapping any one of the first protrusion and the second protrusion.

A display panel according to embodiments includes a plurality of first data lines and a plurality of second data lines.

The plurality of second data lines are directly connected to the fan-out lines corresponding to each of the plurality of second data lines, but the plurality of first data lines are connected to the fan-out lines corresponding to each of the plurality of first data lines through the plurality of first data connection lines and the plurality of second data connection lines. Accordingly, the fan-out lines corresponding to the plurality of first data lines do not need to be disposed parallel to the fan-out lines corresponding to the plurality of second data lines in a predetermined direction, and thus the width in a predetermined direction of an area in which the fan-out lines are disposed in the non-display area may be reduced. Accordingly, since the width of the non-display area may be reduced, it may be advantageous in improving the floor area ratio and enhancing the resolution of the display panel.

In addition, the display panel according to the embodiments includes a plurality of first data lines, a plurality of second data lines, and a plurality of first data connection lines that are each disposed in a form including a line pattern portion extending in a predetermined direction, and a first protrusion and a second protrusion corresponding to each of the neighboring pixel areas and having a width wider than the line pattern portion.

An embodiment may be related to a display panel. The display panel may include a substrate, a first insulating layer, a first pixel, a second pixel, a first data line, a second data line, and a first data connection line. The substrate may include a middle area. Each of the first insulating layer, the first pixel, and the second pixel may overlap the substrate. The second pixel may be disposed closer to the middle area than the first pixel in a first direction. The first data line may be electrically connected to the first pixel, may include a first line member, and may include a first protrusion and a second protrusion both protruding from the first line member and being wider than the first line member in the first direction. The second data line may extend in a second direction different from the first direction, may be electrically connected to the second pixel, may include a second line member, and may include a third protrusion and a fourth protrusion both protruding from the second line member and being wider than the second line member in the first direction. The first data connection line may extend parallel to the second data line, may be electrically connected to the first data line, may be disposed closer to the second data line than to the first data line, may include a third line member, and may include a fifth protrusion and a sixth protrusion both protruding from the third line member and being wider than the third line member in the first direction. The first data line, the second data line, and the first data connection line may be disposed directly on a (same) surface of the first insulating layer. The first protrusion, the third protrusion, and the fifth protrusion may be aligned in the first direction.

The display panel may include a second data connection line. The second data connection line may be spaced from the surface of the first insulating layer, may extend in the first direction, and may electrically connect the first data connection line to the first data line.

The display panel may include the following elements: a driving circuit; a first intermediate connection line electrically connected through the first data connection line and the second data connection line to the first data line, wherein the first data line may be electrically connected through the first intermediate connection line to the driving circuit; and a second intermediate connection line directly connected to the second data line, wherein the second data line may be electrically connected through the second intermediate connection line to the driving circuit.

The first data line may be electrically connected to the first pixel through a transistor contact hole exposing the first protrusion. The first data line may be electrically connected to the second data connection line through a first line contact hole exposing the first protrusion or the second protrusion. The first data connection line may be electrically connected to the second data connection line through a second line contact hole exposing the fifth protrusion or the sixth protrusion.

The display panel may include a first dummy line disposed directly on the surface of the first insulating layer, including a fourth line member, and including a seventh protrusion and eighth protrusion both protruding from the fourth line member in the first direction. The fourth line member may extend in the second direction, may be spaced from the third line member in the second direction, and may be aligned with the third line member in the second direction.

The display panel may include the following elements: a second insulating layer, wherein the second data connection line may be disposed directly on a surface of the second insulating layer; a second dummy line disposed directly on the surface of the second insulating layer, extending in the first direction, and spaced from the second data connection line in the first direction, wherein a side of the second dummy line may be aligned with a side the second data connection line in the first direction; a first power supply line disposed directly on the surface of the second insulating layer, extending in the first direction, spaced from each of the second data connection line and the second dummy line in the second direction, and configured to supply a first power; and a second power supply line disposed directly on the surface of the first insulating layer, including a fifth line member extending in the second direction, including a ninth protrusion and a tenth protrusion both protruding from the fifth line member in the first direction, and configured to supply a second power lower than the first power.

The first protrusion may be a mirror image of the ninth protrusion in a plan view of the display panel.

The third protrusion may be a mirror image of the fifth protrusion or the seventh protrusion in a plan view of the display panel.

The display panel may include a third data line disposed directly on the surface of the first insulating layer, overlapping the middle area, including a sixth line member, and including an eleventh protrusion and a twelfth protrusion both protruding from the sixth line member in the first direction, wherein the eleventh protrusion may be a mirror image of the ninth protrusion in a plan view of the display panel.

The first dummy line may be electrically connected to the second dummy line through a first power contact hole exposing the seventh protrusion or the eighth protrusion, and wherein the second power supply line may be electrically connected to the second dummy line through a second power contact hole exposing the ninth protrusion or the tenth protrusion.

Some of the first protrusion, the second protrusion, the third protrusion, the fourth protrusion, the fifth protrusion, the sixth protrusion, the seventh protrusion, the eighth protrusion, the ninth protrusion, and tenth protrusion may be overlapped with contact holes. Other ones of the first protrusion, the second protrusion, the third protrusion, the fourth protrusion, the fifth protrusion, the sixth protrusion, the seventh protrusion, the eighth protrusion, the ninth protrusion, and tenth protrusion may be not overlapped with any contact holes.

The display panel may include the following elements: a semiconductor layer disposed on the substrate; a first gate layer disposed on a first gate insulating layer covering the semiconductor layer; a second gate layer disposed on a second gate insulating layer covering the first gate layer; a first source/drain layer disposed on an interlayer insulating layer covering the second gate layer; a second source/drain layer disposed on a first planarization layer covering the first source/drain layer; a third source/drain layer disposed on a second planarization layer covering the second source/drain layer; and a third planarization layer covering the third source/drain layer. The second source/drain layer may include the second data connection line, the second dummy line, and the first power supply line. The third source/drain layer may include the first data line, the second data line, the first data connection line, the first dummy line pattern, and the second power supply line.

The display panel may include the following elements: a light emitting layer disposed on the third planarization layer and including a light emitting element of the first pixel; and an encapsulation structure layer covering the light emitting layer.

The first pixel may include a first light emitting element configured to emit light of a first color and overlapping each of the first protrusion, the second protrusion, the ninth protrusion, and the tenth protrusion. The second pixel may include a second light emitting element configured to emit light of a second color different from the first color and overlapping the second line member.

The first pixel may emit red light or blue light. The second pixel may emit green light.

The second light emitting element may overlap the third line member.

The first pixel may include a first light emitting element configured to emit light of a first color and overlapping the first line member. The second pixel may include a second light emitting element configured to emit light of a second color different from the first color and overlapping each of the third protrusion and the sixth protrusion.

The first pixel may emit red light or blue light. The second pixel may emit green light.

The first light emitting element may overlap the fifth line member.

The second data line may be electrically connected to the second pixel through a transistor contact hole exposing the third protrusion or the fourth protrusion.

According to embodiments, protrusions of conductive lines of the display panel may form symmetrical structures. Accordingly, desirable pattern symmetry between the conductive lines may be substantially maintained.

According to embodiments, most of the light of the light emitting elements of pixel areas may be emitted forward without being biased in a specific direction.

Advantageously, unwanted differences in display quality according to the field of view and/or viewing angles may be minimized, and images displayed by the display panel may be satisfactory.

BRIEF DESCRIPTION OF THE DRAWINGS

Each of FIG. 13

FIG. 16 illustrates the semiconductor pattern layer of FIG. 13 according to an embodiment.

Each of FIG. 22, FIG. 23, FIG. 24.

DETAILED DESCRIPTION OF EMBODIMENTS

Figure 1:
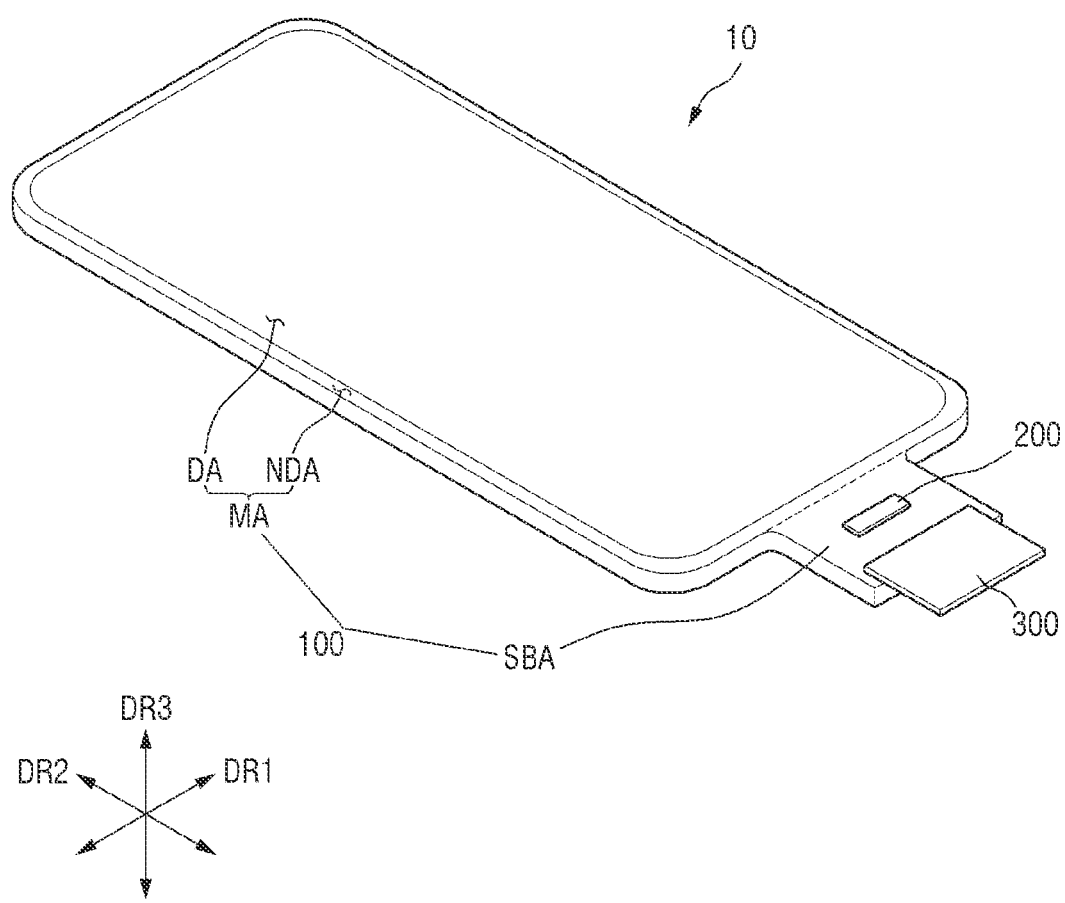
FIG. 1 illustrates a perspective view of a display device according to an embodiment.

Examples of embodiments are described with reference to the accompanying drawings. Practical embodiments may be provided in different forms and should not be construed as being limited by the described examples. The same reference numbers may indicate the same or similar components. In the drawings, dimensions may be exaggerated for clarity.

The spatially relative terms "below," "beneath," "lower," "above," "upper," or the like may be used to describe the relations between one element and another element as illustrated in the drawings. The spatially relative terms may encompass different orientations of the device in use or operation, in addition to the orientation depicted in the drawings. For example, in the case where a device illustrated in the drawing is turned over, a first element positioned "below" or "beneath" a second element may be placed "above" the second element. Accordingly, the illustrative term "below" may include both the lower and upper positions. The device may also be oriented in other directions and thus the spatially relative terms may be interpreted differently depending on the orientations.

The terms "comprises," "comprising," "has," "have," "having," "includes" and/or "including" may specify the presence of stated features, integers, steps, operations, elements, and/or components, but may not preclude the presence or addition of other features, integers, steps, operations, elements, and/or components.

Although the terms "first," "second," "third," or the like may be used to describe various elements, these elements should not be limited by these terms. These terms are used to distinguish one element from another element or for the convenience of description and explanation. For example, "a first element" may be termed "a second element" or "a third element" without departing from the teaching of one or more embodiments. The description of an element as a "first"

element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The terms "about" or "approximately" is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within±30%, 20%, 10%, 5% of the stated value.

The term "on" may mean "directly on" or "indirectly on." The term "connect" may mean "directly connect" or "indirectly connect." The term "connect" may mean "mechanically connect" and/or "electrically connect." The term "connection" may mean "electrical connection." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" may mean "immediately adjacent." The term "neighbor" may mean "immediately neighbor." The expression that an element extends in a particular direction may mean that the element extends lengthwise in the particular direction and/or that the lengthwise direction of the element is in the particular direction. The noun "pattern" may mean "member." The noun "portion" may mean "member" or "structure." The verb "define" may mean "form" or "provide." The expression that a space or opening overlaps an object may mean that (the position of) the space or opening overlaps with (the position of) the object. The term "overlap" may be equivalent to "be overlapped by." The expression that a first element overlaps with a second element in a plan view may mean that the first element overlaps the second element in direction perpendicular to a substrate. The expression "of FIG. X" may mean "illustrated in FIG. X." The expression "disposed on the same layer" may mean "disposed directly on (the same surface of) the same (insulating) layer."

Unless otherwise defined or implied, all terms used herein (including technical and scientific terms) have the same meaning as commonly understood by those skilled in the art to which this disclosure pertains. Terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 illustrates a perspective view of a display device 10 according to one embodiment.

Referring to FIG. 1, the display device 10 may display a moving image or a still image. The display device 10 may be used as a display screen of an electronic device, such as a television, a laptop computer, a monitor, a billboard, an Internet-of-Things (IOT) device, a mobile phone, a smartphone, a tablet personal computer (PC), a smart watch, a watch phone, a mobile communication terminal, an electronic notebook, an electronic book, a portable multimedia player (PMP), a navigation device, or an ultra-mobile PC (UMPC).

The display device 10 may be a light emitting display device such as an organic light emitting display using an organic light emitting diode, a quantum dot light emitting display including a quantum dot light emitting layer, an inorganic light emitting display including an inorganic semiconductor, or a micro light emitting display using a micro or nano light emitting diode (LED).

The display device 10 includes a display panel 100, a display driving circuit 200, and a circuit board 300.

Figure 2:
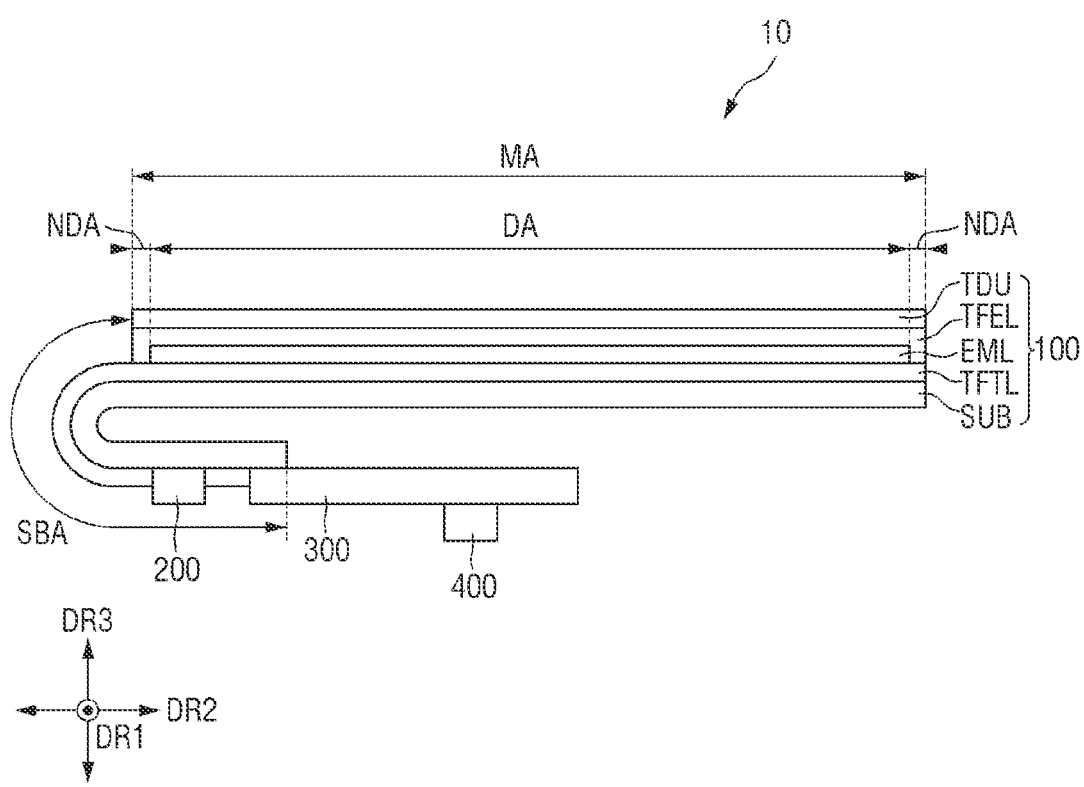
FIG. 2 illustrates a cross section of the display device of FIG. 1 according to an embodiment.

The display panel 100 may include a substrate SUB (illustrated in FIG. 2). The display panel 100 may include a main area MA and a sub-area SBA protruding from one side of the main area MA. The substrate SUB may include a main area MA and a sub-area SBA respectively corresponding to the main area MA and sub-area SBA of the display panel 100.

The main area MA includes a display area DA that may emit light for displaying an image, and includes a non-display area NDA abutting the display area DA.

The display area DA may correspond to most of the main area MA.

The display area DA may have a polygonal shape such as a quadrilateral shape or a circle shape. For example, the display area DA may have a rectangular shape having a short side in a first direction DR1 and a long side in a second direction DR2 different from the first direction DR1.

The short side in the first direction DR1 and the long side in the second direction DR2 may form a right-angled corner. Between the short side in the first direction DR1 and the long side in the second direction DR2, there may be a curved corner having a predetermined curvature.

The non-display area NDA may surround the display area DA. The non-display area NDA may be an edge area of the display area DA.

The display panel 100 may be in the form of a flat plate. The display panel 100 may be flexible and may include a curved portion with a predetermined curvature. The display panel 100 may be flexible, bendable, foldable, and/or a rollable. The display panel 100 may include a bent edge.

The display driving circuit 200 may generate signals and voltages for driving the display panel 100. The display driving circuit 200 may be/include an integrated circuit (IC) and may be attached to the display panel 100 by a chip on glass (COG) method, a chip on plastic (COP) method, or an ultrasonic bonding method. The display driving circuit 200 may be attached to the circuit board 300 in a chip on film (COF) method.

The circuit board 300 may be attached to an edge of the sub-area SBA of the display panel 100.

The circuit board 300 may be electrically connected to the display panel 100 and the display driving circuit 200 through a signal pad PD (illustrated in FIG. 6) disposed at the edge of the sub-area SBA of the display panel 100.

The circuit board 300 may supply digital video data, timing signals, and driving voltages to the display panel 100 and the display driving circuit 200. The circuit board 300 may be a flexible printed circuit board, a printed circuit board, or a flexible film such as a chip on film.

FIG. 2 illustrates a cross section of the display device of FIG. 1 according to an embodiment.

FIG. 2 illustrates that a portion of the sub-area SBA adjacent to the main area MA is bent, such that another portion of the sub-area SBA overlaps the main area MA in a third direction DR3 different from each of the directions DR1 and DR2.

The display driving circuit 200 mounted on the sub-area SBA and the circuit board 300 attached to one side of the sub-area SBA are disposed below the display panel 100 together with the sub-area SBA.

Referring to FIG. 2, the display panel 100 may include a thin film transistor layer TFTL disposed on the substrate SUB, a light emitting array layer EML disposed on the thin film transistor layer TFTL, and a thin film encapsulation layer TFEL covering the light emitting array layer EML.

The display panel 100 may further include a touch sensing unit TDU disposed on the encapsulation structure layer TFEL.

The substrate SUB may be formed of an insulating material such as polymer resin. For example, the substrate SUB may be formed of polyimide. The substrate SUB may be a flexible substrate that may be bendable, foldable, and/or rollable.

The thin film transistor layer TFTL may be arranged in the main area MA and the sub-area SBA. The thin film transistor layer TFTL includes thin film transistors.

The light emitting array layer EML may be disposed in the display area DA of the main area MA. The light emitting array layer EML includes light emitting elements disposed in the display area DA.

The encapsulation structure layer TFEL corresponds to at least the display area DA of the main area MA. The encapsulation structure TFEL may further correspond to a portion of the non-display area NDA adjacent to the display area DA.

The encapsulation structure layer TFEL may include at least one inorganic layer and at least one organic layer to encapsulate the light emitting array layer EML.

The touch sensing unit TDU may correspond to at least the display area DA of the main area MA. The touch sensing unit TDU may generate a sensing signal for sensing a point at which a person or an object touches the display area DA.

The display device 10 may include a cover window (not illustrated) disposed on the touch sensing unit TDU of the display panel 100. The cover window is for protecting the upper portion of the display panel 100 from external physical and electrical shocks. The cover window may be attached onto the touch sensing unit TDU with a transparent adhesive material such as an optically clear adhesive (OCA) film or an optically clear resin (OCR). The cover window may be made of an inorganic material such as glass, or an organic material such as plastic or a polymer material.

The display device 10 may further include an anti-reflection member (not illustrated) disposed between the touch sensing unit TDU and the cover window. The anti-reflection member is to reduce the reflection of external light reflected by components of the display panel 100 and emitted to the outside. The anti-reflection member may be a polarizing film or a color filter.

The display device 10 may further include a touch driving circuit 400 for driving the touch sensing unit TDU.

The touch driving circuit 400 may be an integrated circuit (IC) attached to the circuit board 300.

The touch driving circuit 400 may be electrically connected to driving electrodes and sensing electrodes of the touch sensing unit TDU through the circuit board 300, the signal pad PD of the sub-area SBA, and the like.

The touch driving circuit 400 may apply a touch driving signal to the driving electrodes, and may sense a touch sensing signal of each of the touch nodes, for example, a charge change amount of mutual capacitance through the sensing electrodes. The touch driving circuit 400 may determine whether the user's touch occurs, whether the user is proximate, and the like, according to the touch sensing signals of each of the touch nodes.

The user's touch may mean that an object such as a user's finger or pen is in direct contact with the front surface of the display device 10 disposed on the touch sensing unit TDU. The proximity of the user indicates that an object such as a user's finger or a pen is positioned away from but within a predetermined distance from the front surface of the display device 10.

Figure 3:
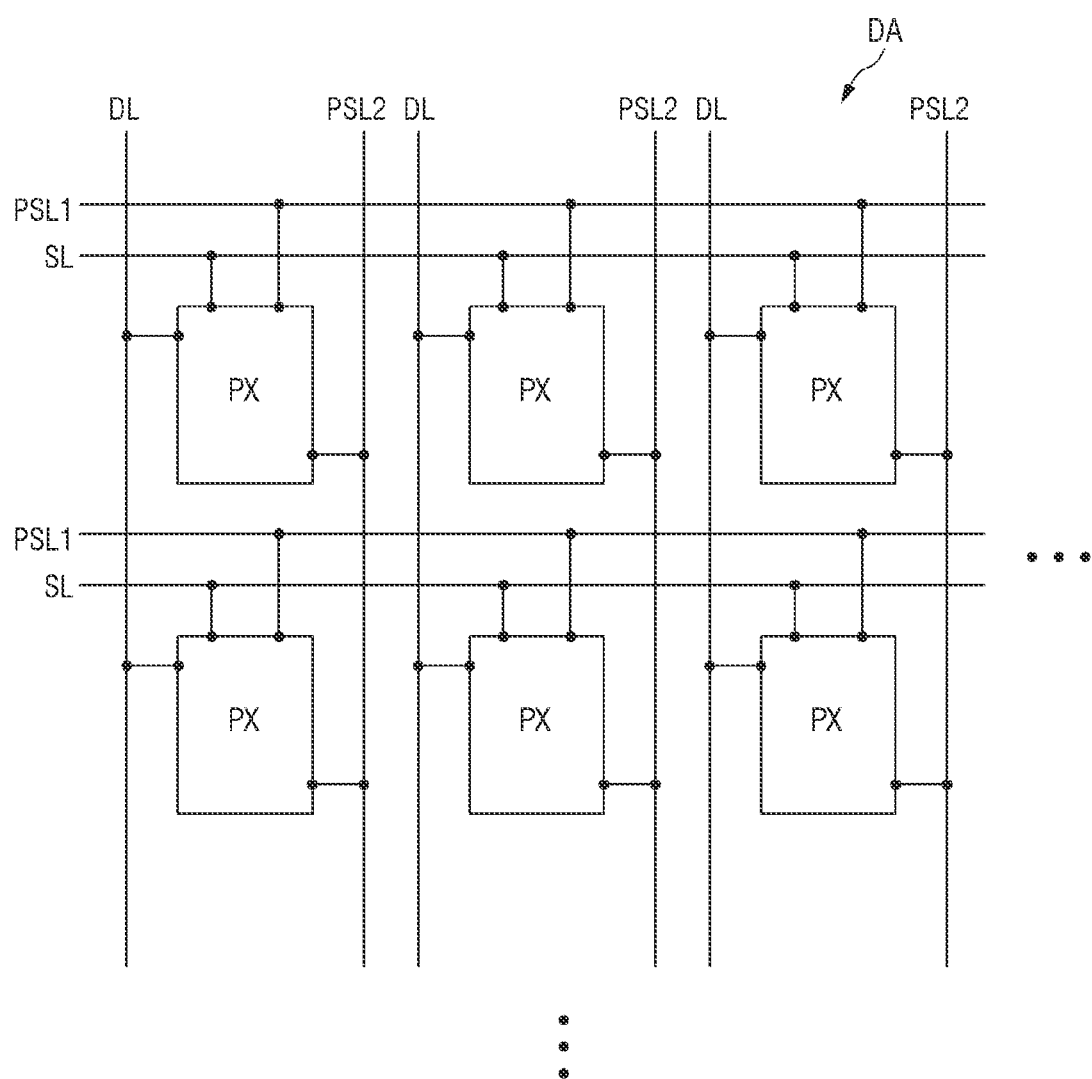
FIG. 3 illustrates a portion of the display area of FIG. 2 according to an embodiment.

FIG. 3 illustrates a portion of the display area of FIG. 2 according to an embodiment.

Referring to FIG. 3, the display panel 100 includes pixels PX arranged in a matrix (e.g., a two-dimensional array) in the display area DA.

The display panel 100 may further include scan lines SL disposed in the display area DA and extending in the first direction DR1, and data lines DL disposed in the display area DA and extending in the second direction DR2.

The display panel 100 may further include a first power supply line PSL1 and a second power supply line PSL2 disposed in the display area DA.

The first power supply line PSL1 may supply a predetermined first driving power to the pixels PX.

The second power supply line PSL2 may supply a second driving power having a voltage level lower than that of the first driving power to the pixels PX.

Each of the pixels PX may be connected to a scan line SL, a data line DL, the first power supply line PSL1, and the second power line supply line PSL2.

Figure 4:
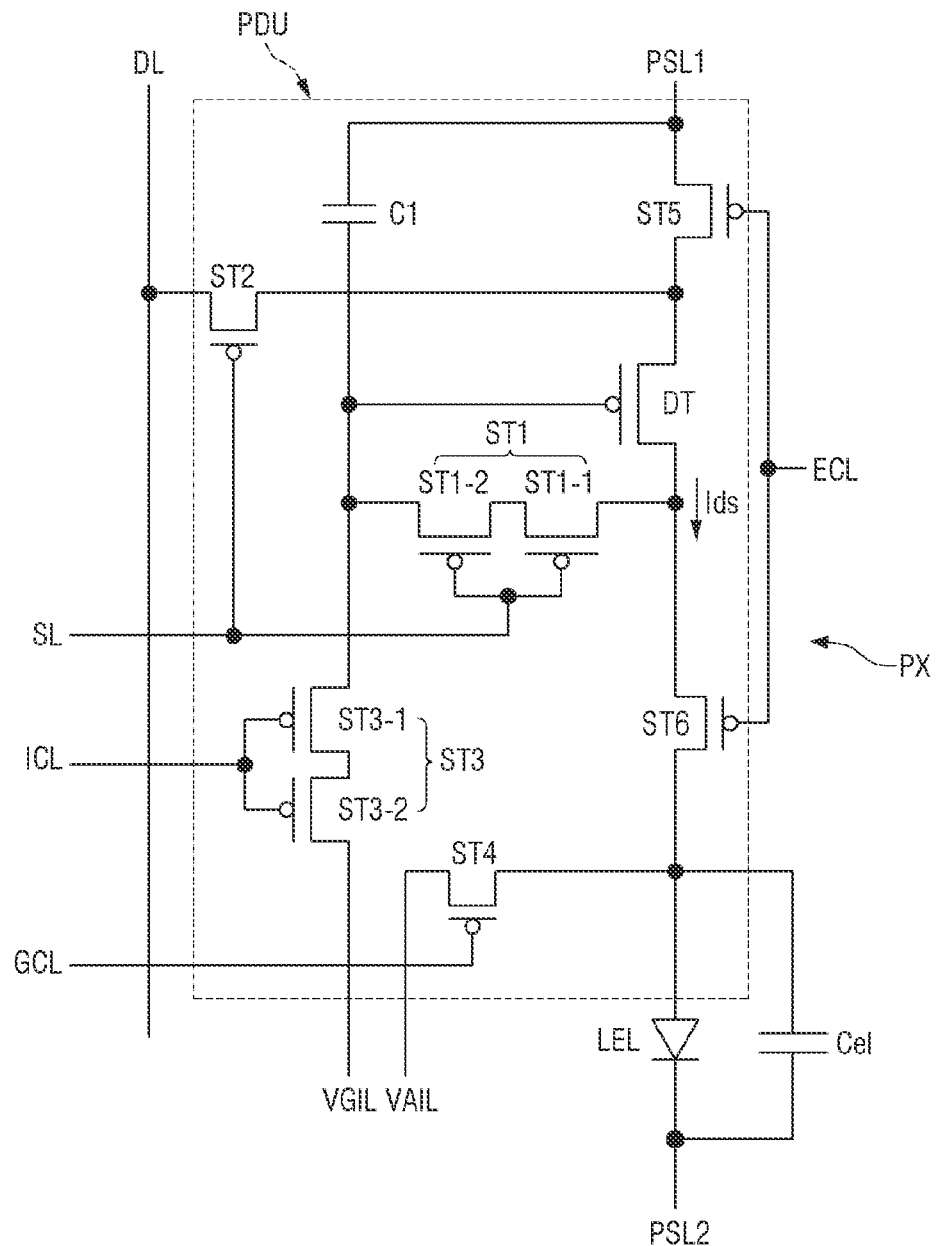
FIG. 4 illustrates an equivalent circuit corresponding to a pixel of FIG. 3 according to an embodiment.
Figure 5:
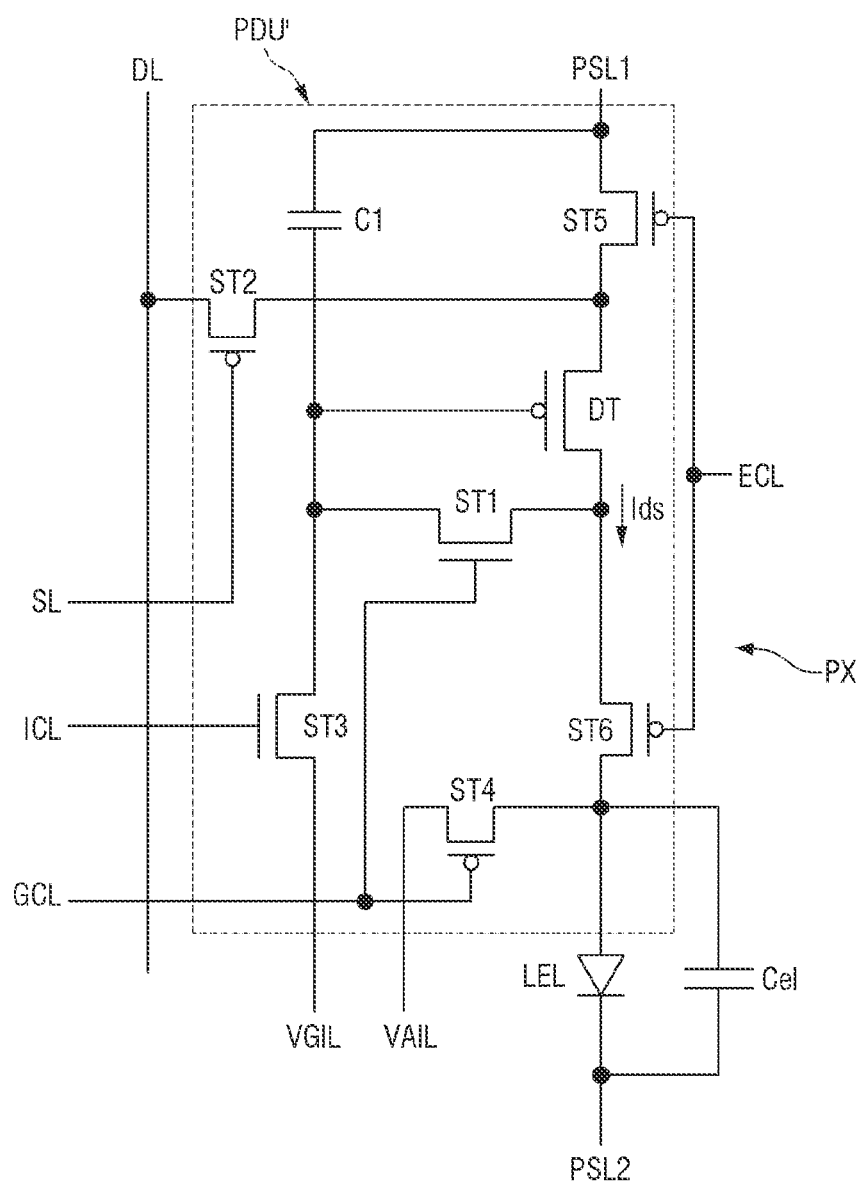
FIG. 5 illustrates an equivalent circuit corresponding to a pixel of FIG. 3 according to an embodiment.

FIG. 4 illustrates an equivalent circuit corresponding to a pixel of FIG. 3 according to an embodiment. FIG. 5 illustrates an equivalent circuit corresponding to a pixel of FIG. 3 according to an embodiment.

Referring to FIG. 4, a pixel area PX may include a light emitting element LEL and a pixel driving unit PDU that supplies a driving current to the light emitting element LEL.

The pixel driving unit PDU may include a driving transistor DT, at least one switch element, and at least one capacitor. For example, the pixel driving unit PDU may include a first transistor (switch transistor) ST1, a second transistor ST2, a third transistor ST3, a fourth transistor ST4, a fifth transistor ST5, and a sixth transistor ST6.

The driving transistor DT includes a gate electrode, a first electrode, and a second electrode, and is connected in series with the light emitting element LEL between the first power supply line PSL1 and the second power supply line PSL2.

The driving transistor DT transmits a drain-source current based on the data signal supplied to the gate electrode.

The drain-source current is a driving current of the light emitting element LEL.

The light emitting element LEL emits light having a luminance corresponding to the driving current transmitted by the driving transistor DT.

The light emitting element LEL may include an anode electrode, a cathode electrode, and a light emitting layer disposed between the anode electrode and the cathode electrode. For example, the light emitting element LEL may be an organic light emitting diode having a light emitting layer made of an organic light emitting material. The light emitting element LEL may be an inorganic light emitting element including a light emitting layer made of an inorganic semiconductor. The light emitting element LEL may be a quantum dot light emitting element having a quantum dot light emitting layer. The light emitting element LEL may be a micro light emitting diode.

A capacitor Cel connected in parallel with the light emitting element LEL is a parasitic capacitance between the anode electrode and the cathode electrode.

A capacitor C1 is connected between the first power supply line PSL1 and the gate electrode of the driving transistor DT.

The first transistor ST1 is connected between the second electrode of the driving transistor DT (corresponding to the second power supply line PSL2) and the source electrode of the driving transistor DT, and is turned on based on a scan signal supplied through the scan line SL.

The second transistor ST2 is connected between the data line DL and the gate electrode of the driving transistor DT, and is turned on based on a scan signal supplied through the scan line SL.

Accordingly, when the scan signal is supplied to the scan line SL, the first transistor ST1 and the second transistor ST2 are turned on. As a result, the data signal transmitted through the data line DL is supplied to the gate electrode of the driving transistor DT and the capacitor C1 through the turned-on second transistor ST2. In addition, the gate electrode and the second electrode of the driving transistor DT have the same potential through the turned-on first transistor ST1. In addition, the capacitor C1 receives the data signal. Accordingly, a drain-source current may be generated between the first electrode and the second electrode of the driving transistor DT, and the supply of the drain-source current by the driving transistor DT may be maintained based on the voltage charged in the capacitor C1.

The third transistor ST3 is connected between a gate initialization voltage line VGIL and the gate electrode of the driving transistor DT, and is turned on based on the initialization control signal transmitted by an initialization control line ICL. When the third transistor ST3 is turned on, the potential of the gate electrode of the driving transistor DT is initialized to the first initialization voltage by a gate initialization voltage line VIL.

The fourth transistor ST4 is connected between an anode initialization voltage line VAIL and the anode electrode of the light emitting element LEL, and is turned on based on the gate control signal transmitted by a gate control line GCL. When the fourth transistor ST4 is turned on, the potential of the anode electrode of the light emitting element LEL is initialized to the second initialization voltage by the anode initialization voltage line VAIL.

The fifth transistor ST5 is connected between the first power supply line PSL1 and the driving transistor DT, and the sixth transistor ST6 is connected between the driving transistor DT and the light emitting element LEL. The fifth transistor ST5 and the sixth transistor ST6 are turned on based on the emission control signal transmitted by an emission control line ECL. When the fifth transistor ST5 and the sixth transistor ST6 are turned on, the driving current provided by the driving transistor DT is supplied to the light emitting element LEL, and the light emitting element LEL emits light based on the driving current.

As illustrated in FIG. 4, all of the driving transistor DT, the first transistor ST1, the second transistor ST2, the third transistor ST3, the fourth transistor ST4, the fifth transistor ST5, and the sixth transistor ST6 that are included in the pixel driving unit PDU may be P-type MOSFETs. In this case, each of the scan signal of the scan line SL, the initialization control signal of the initialization control line ICL, the gate control signal of the gate control line GCL, and the emission control signal of the emission control line ECL may supply a low-level turn-on signal for turning on the corresponding P-type MOSFET.

Some of the switching elements included in the pixel driving unit PDU may be P-type MOSFETs, and the other ones may be N-type MOSFETs. The P-type MOSFETs and the N-type MOSFETs may include active layers of different semiconductor materials. Accordingly, the floor area ratio of the pixel PX may be improved through the stacked structure, and the resolution of the display panel may be advantageously improved.

For example, referring to FIG. 5, according to an embodiment, the driving transistor DT, the second transistor ST2, the fourth transistor ST4, the fifth transistor ST5, and the sixth transistor ST6 among the switch elements of the pixel driving unit PDU' may be P-type MOSFETs having an active layer of polysilicon semiconductor material, and the first transistor ST1 and the third transistor ST3 may be N-type MOSFETs having an active layer of an oxide semiconductor material.

In this case, since the first transistor ST1 is not turned on with the same signal as the signal for the second transistor ST2, the gate electrode of the first transistor ST1 may be connected to the gate control line GCL instead of the scan line SL. In this way, the fourth transistor ST4 may be turned on when the gate control line GCL supplies a low level signal, and the first transistor ST1 may be turned on when the gate control line GCL supplies a high level signal.

The third transistor ST3 may be turned on when the initialization control line ICL supplies a high level signal.

Figure 6:
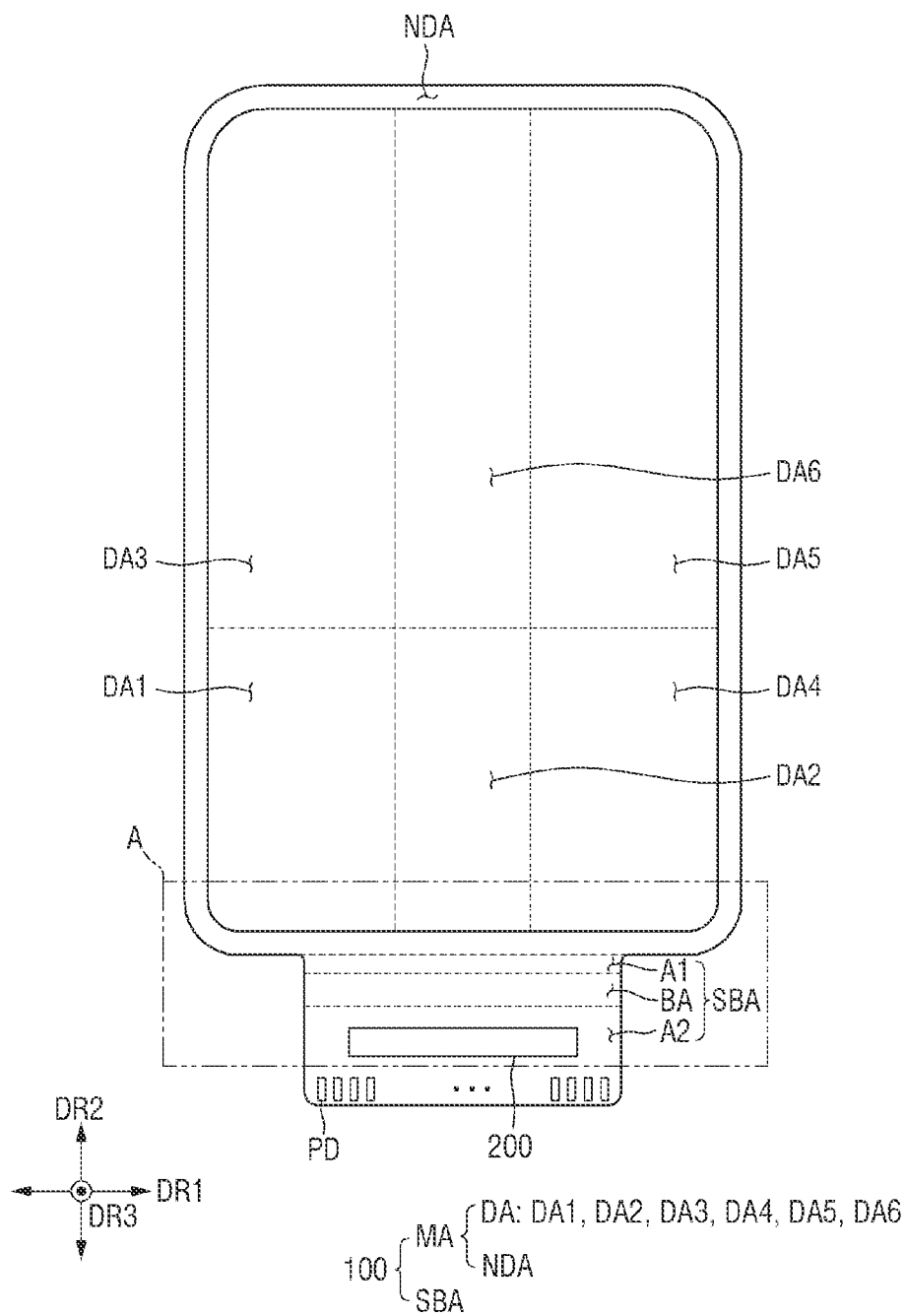
FIG. 6 illustrates a plan view of the display panel of FIG. 1 according to an embodiment.
Figure 7:
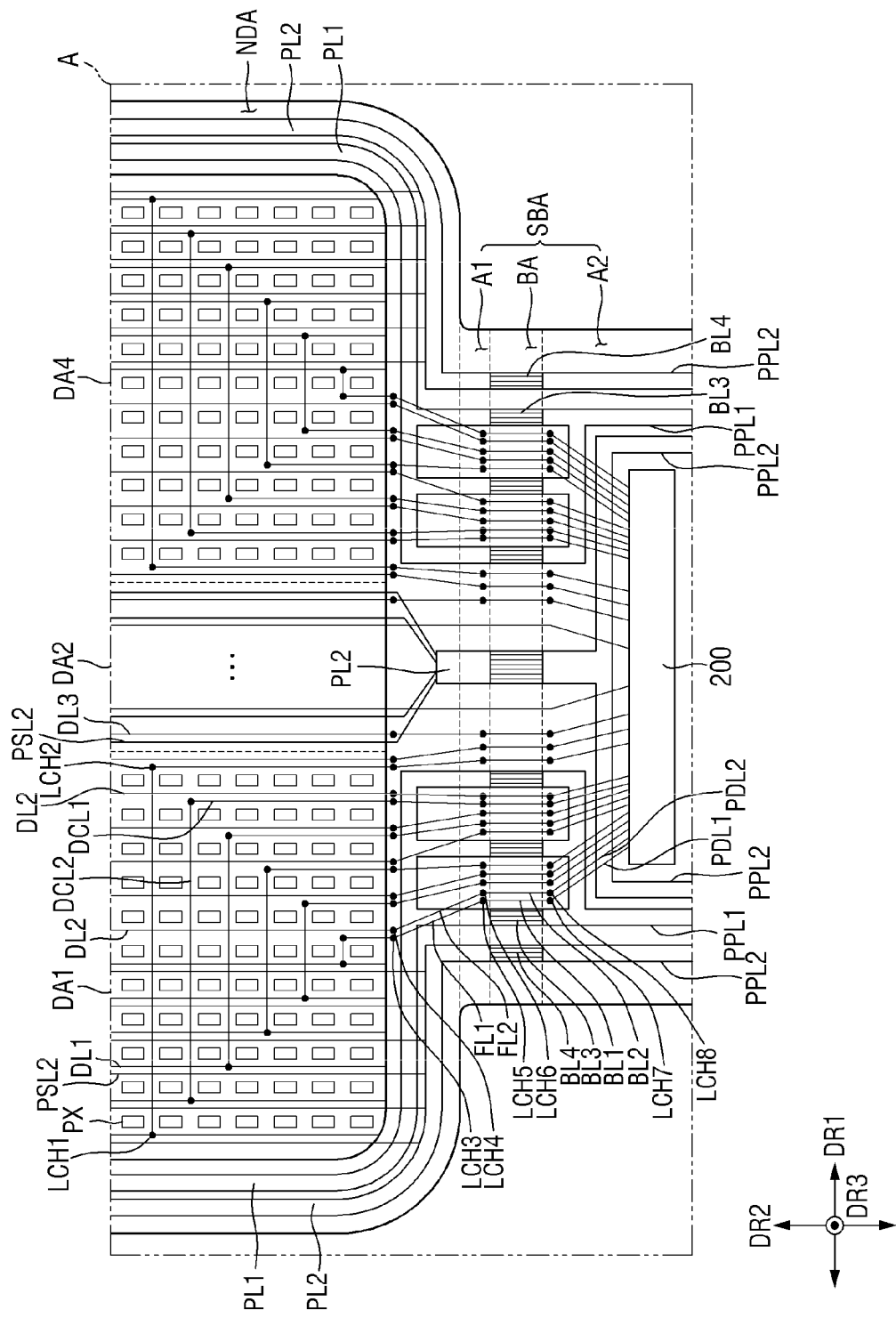
FIG. 7 illustrates a layout corresponding to portion A of FIG. 6 according to an embodiment.
Figure 8:
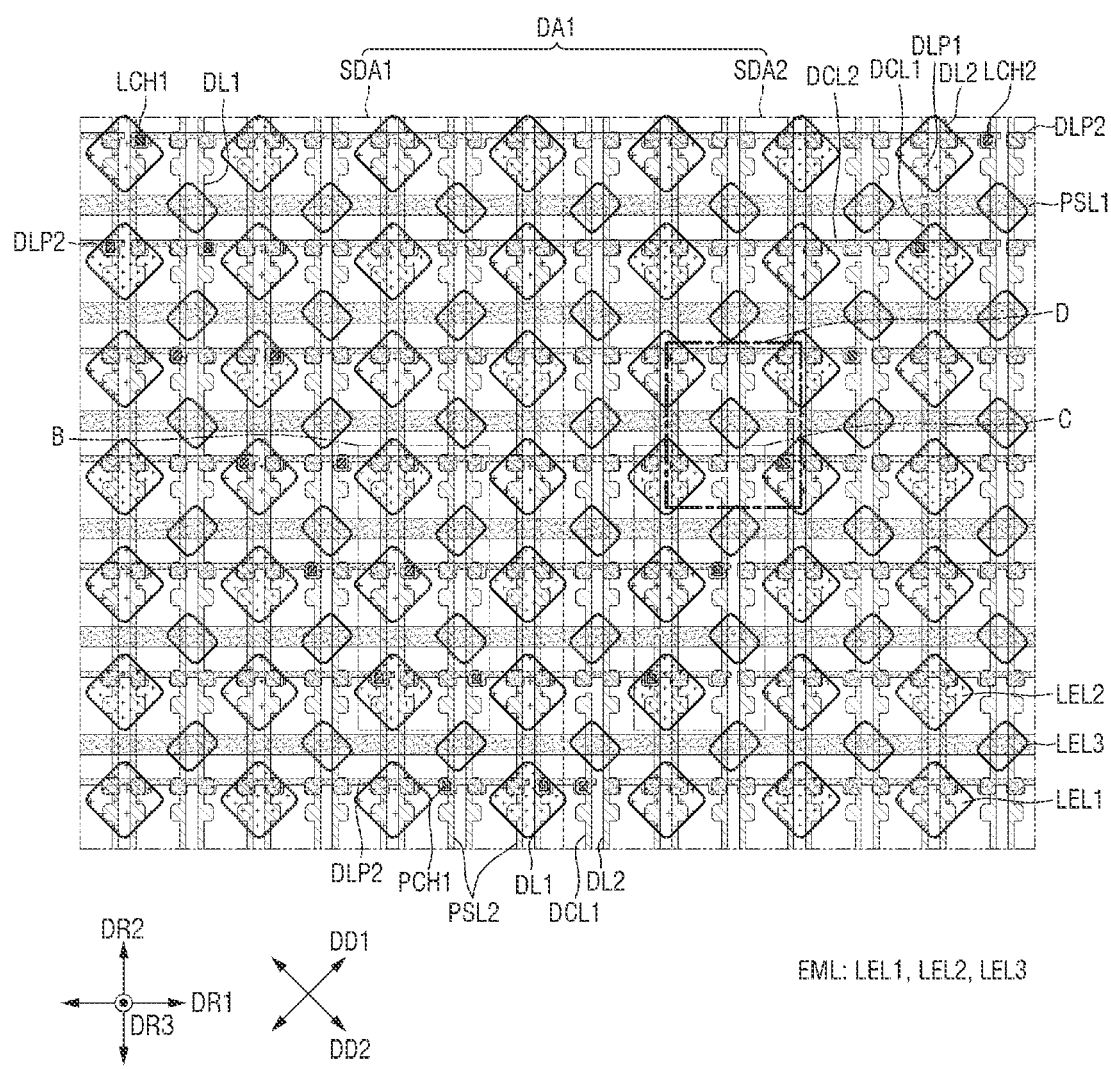
FIG. 8 illustrates a layout corresponding to a portion of the first display area of FIG. 6 according to an embodiment.
Figure 9:
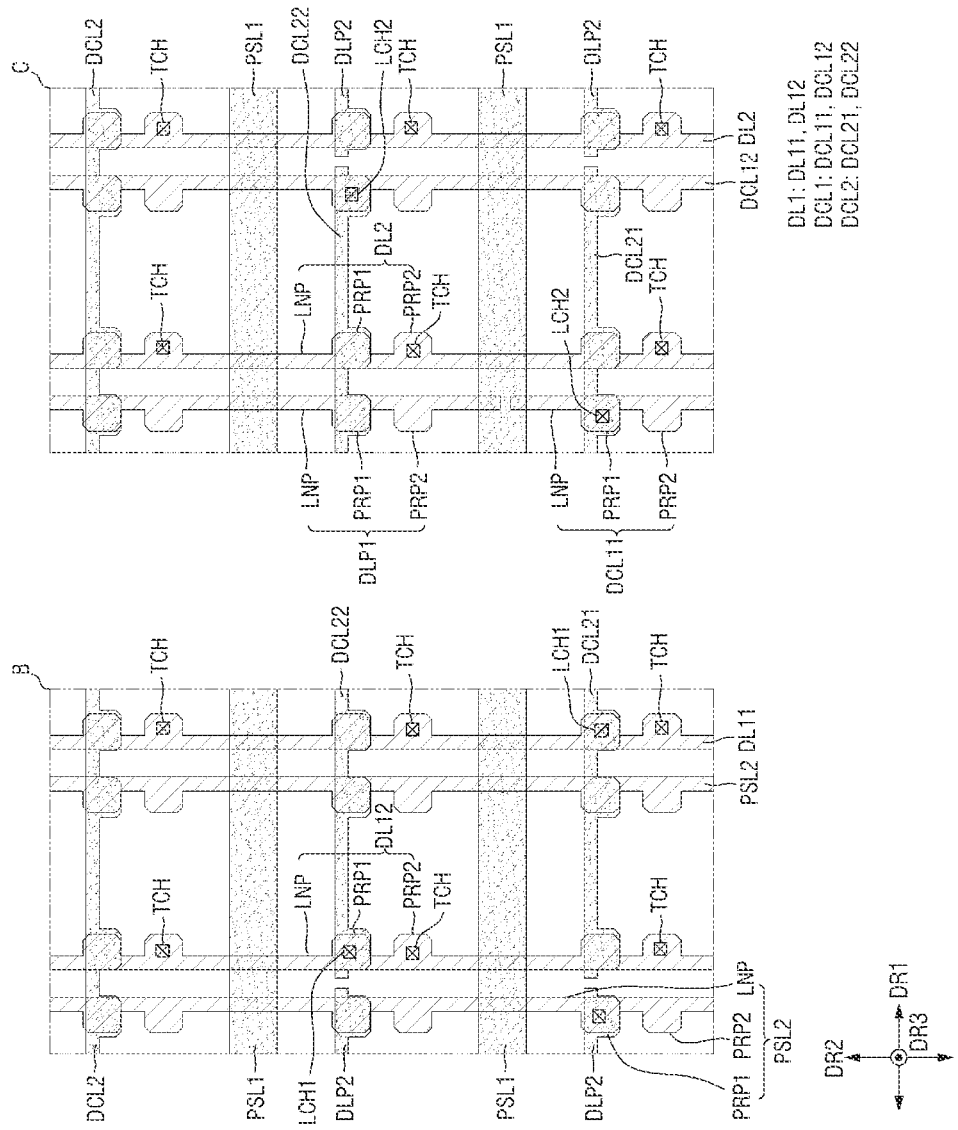
FIG. 9 illustrates layouts corresponding to portion B and portion C of FIG. 8 according to an embodiment.
Figure 10:
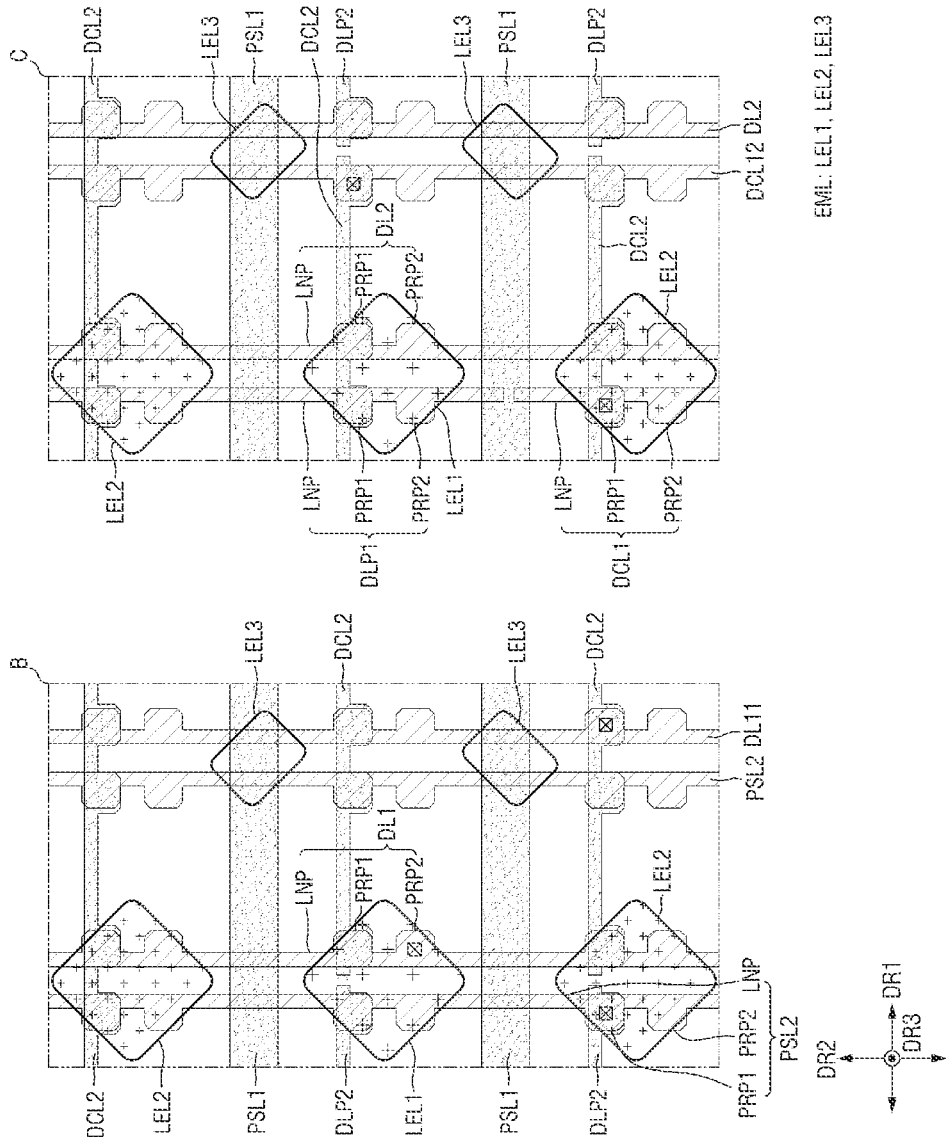
FIG. 10 illustrates the layouts and an arrangement of light emitting elements corresponding to portion B and portion C of FIG. 8 according to an embodiment.
Figure 11:
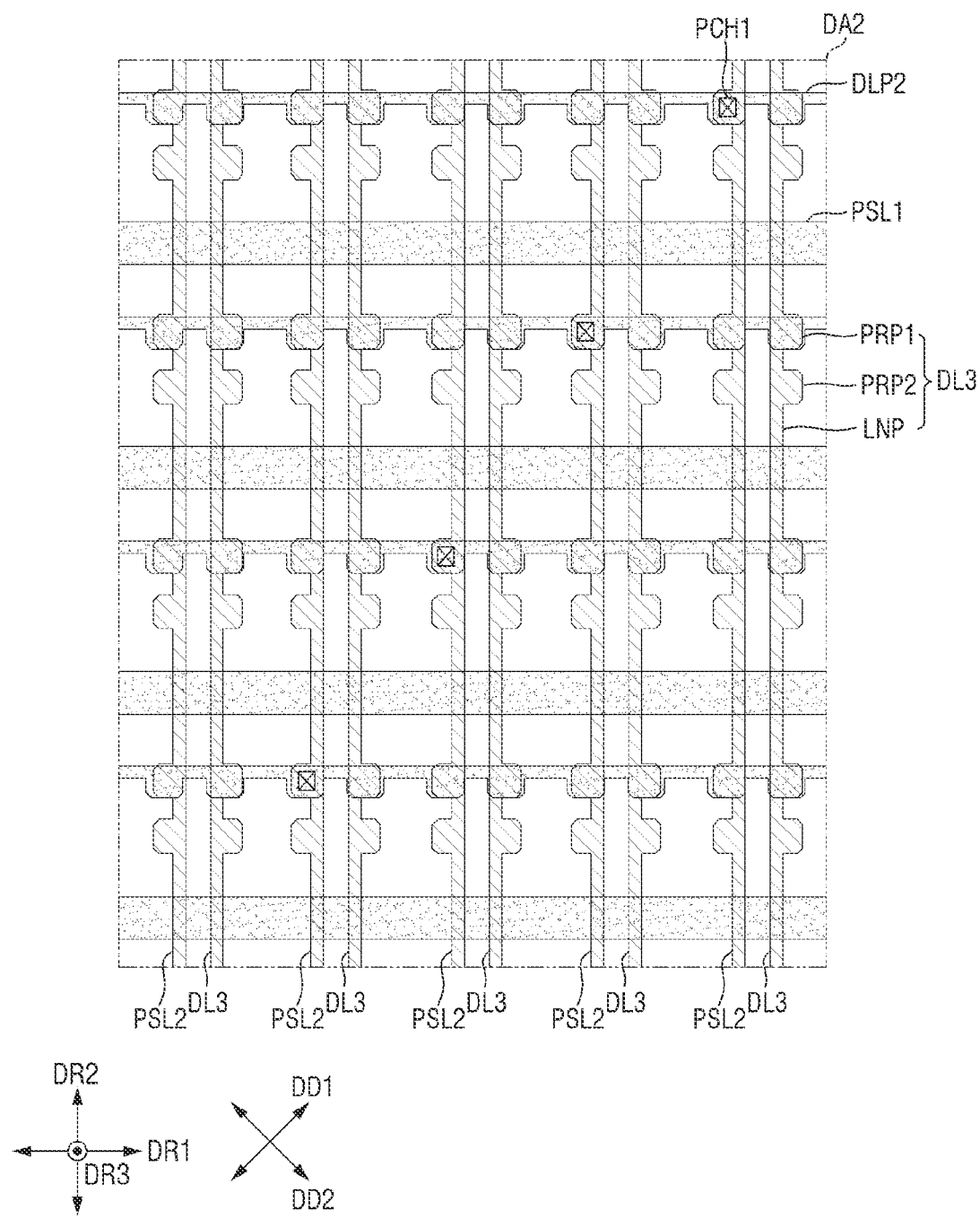
FIG. 11 illustrates a layout corresponding to a portion of the second display area of FIG. 6 according to an embodiment.
Figure 12:
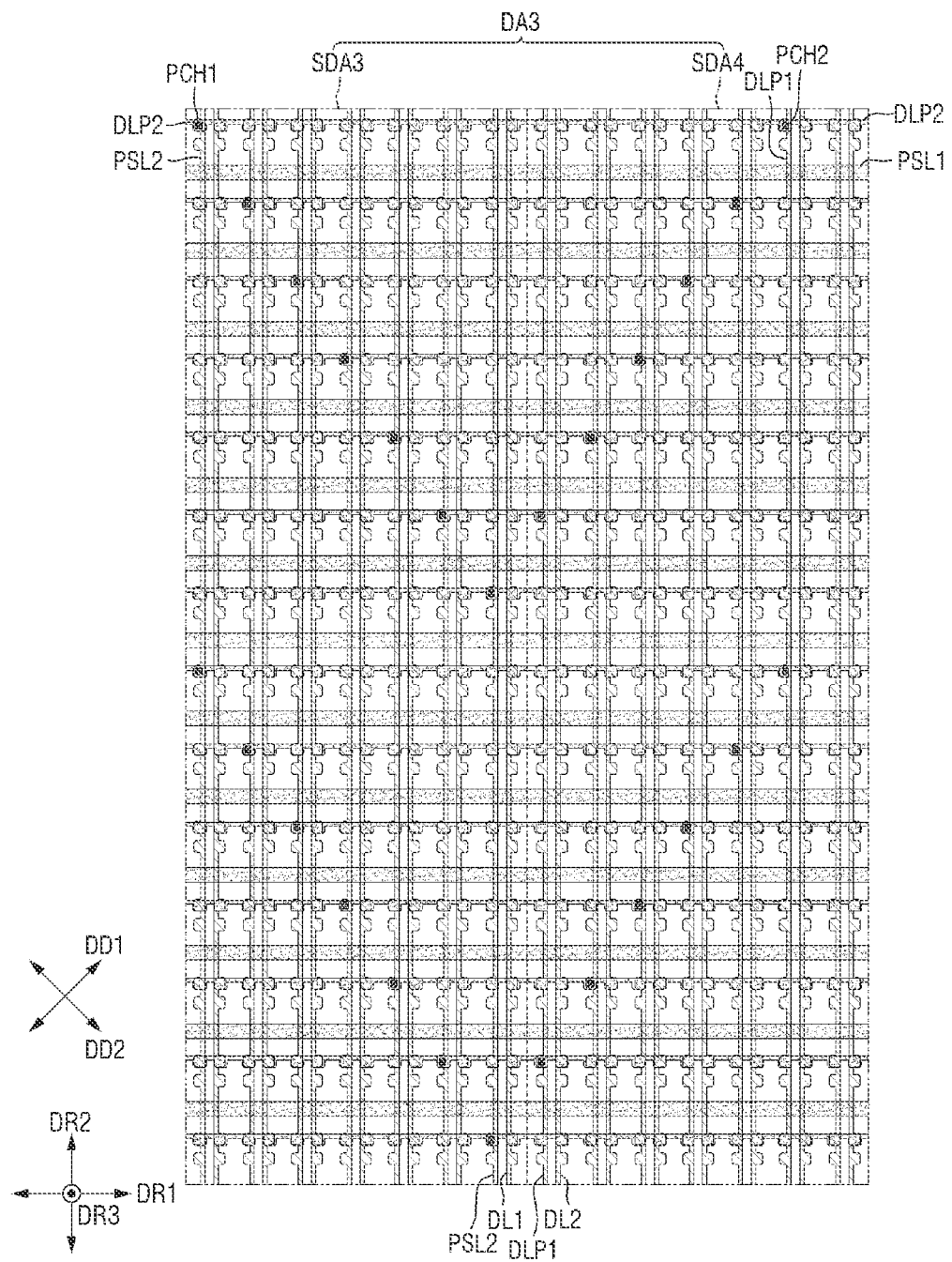
FIG. 12 illustrates a layout corresponding to a portion of the third display area of FIG. 6 according to an embodiment.

FIG. 6 illustrates a plan view of the display panel 100 of FIG. 1 according to an embodiment. FIG. 7 illustrates a layout corresponding to portion A of FIG. 6 according to an embodiment. FIG. 8 illustrates a layout corresponding to a portion of the first display area of FIG. 6 according to an embodiment. FIG. 9 illustrates layouts corresponding to portion B and portion C of FIG. 8 according to an embodiment. FIG. 10 illustrates the layouts and an arrangement of light emitting elements corresponding to the portion B and the portion C of FIG. 8 according to an embodiment. FIG. 11 illustrates a layout corresponding to a portion of the second display area of FIG. 6 according to an embodiment. FIG. 12 illustrates a layout corresponding to a portion of the third display area of FIG. 6 according to an embodiment.

Referring to FIG. 6, the display panel 100 includes the main area MA and the sub-area SBA protruding from one side of the main area MA.

The main area MA includes the display area DA from which light for image display is emitted, and a non-display area NDA abutting the display area DA.

The display area DA may include a first display area DA1, a second display area DA2, a third display area DA3, a fourth display area DA4, a fifth display area DA5, and a sixth display area DA6 according to a connection structure between the fan-out lines (or intermediate connection lines) and the data lines and/or whether a power contact hole corresponding to the power supply line is disposed.

The first display area DA1 and the fourth display area DA4 are adjacent to the sub-area SBA of the display area DA in the second direction DR2, and are adjacent to the non-display area NDA in the first direction DR1.

Referring to FIG. 6 and FIG. 7, each of the first display area DA1 and the fourth display area DA4 includes sections of first data lines DL1, sections of second data lines DL2, first data connection lines DCL1 connected to the first data lines DL1, and second data connection lines DCL2 connected to the first data lines DL1.

The first data lines DL1 are connected to first fan-out lines FL1, respectively, through the first data connection lines DCL1 extending in the second direction DR2 and the second data connection lines DCL2 extending in the first direction DR1.

The second data lines DL2 are directly connected to second fan-out lines FL2, respectively.

Each of the first display area DA1 and the fourth display area DA4 may further include a first power contact hole PCH1 illustrated in FIG. 8 and FIG. 12.

Referring to FIG. 8, the first power contact hole PCH1 is for connection between a second power supply line PSL2 and a second dummy line pattern DLP2.

The second display area DA2 and the sixth display area DA6 are middle areas of the substrate SUB (and of the display panel 100) and are spaced from the non-display area NDA in the first direction DR1.

The second display area DA2 may be disposed between the first display area DA1 and the fourth display area DA4 in the first direction DR1.

The sixth display area DA6 may be disposed between the third display area DA3 and the fifth display area DA5 in the first direction DR1.

Each of the second display area DA2 and the sixth display area DA6 includes third data lines DL3 illustrated in FIG. 7.

Each of the third data lines DL3 is directly connected to a corresponding fan-out line.

The third display area DA3 and the fifth display area DA5 are spaced from the sub-area SBA in the second direction DR2 and are adjacent to the non-display area NDA in the first direction DR1.

Each of the third display area DA3 and the fifth display area DA5 includes a second power contact hole PCH2 illustrated in FIG. 12.

The second power contact hole PCH2 is to enable connection between the second dummy line pattern DLP2 illustrated in FIG. 12 and a first dummy line pattern DLP1.

The first display area DA1 and the third display area DA3 may have substantially the same length in the first direction DR1.

The second display area DA2 and the sixth display area DA6 may have substantially the same length/width in the first direction DR1.

The fourth display area DA4 and the fifth display area DA5 may have substantially the same length/width in the first direction DR1.

The length/width of the second display area DA2 in the first direction DR1 may be smaller than each of the length/width of the first display area DA1 in the first direction DR1 and the length/width of the fourth display area DR4 in the first direction DR1.

The length/width of the sixth display area DA6 in the first direction DR1 may be smaller than each of the length/width of the third display area DA3 in the first direction DR1 and the length/width of the fifth display area DR5 in the first direction DR1.

All of the first display area DA1, the second display area DA2, and the fourth display area DA4 may have substantially the same length in the second direction DR2.

All of the third display area DA3, the fifth display area DA5, and the sixth display area DA6 may have substantially the same length in the second direction DR2.

The length of the first display area DA1 in the second direction DR2 may be less than or equal to the length of the third display area DA3 in the second direction DR2.

The length of the second display area DA2 in the second direction DR2 may be less than or equal to the length of the sixth display area DA6 in the second direction DR2.

The length of the fourth display area DA4 in the second direction DR2 may be less than or equal to the length of the fifth display area DA5 in the second direction DR2.

The non-display area NDA may abut the edge of the display area DA, and may include an edge of the main area MA of the display panel 100.

The non-display area NDA includes an encapsulation area having a form that surrounds an edge of the display area DA.

The encapsulation area may be disposed adjacent to an edge of the main area MA.

The encapsulation area may include inorganic layers and an organic layer between the inorganic layers and may be part of the encapsulation structure layers TFEL to encapsulate the light emitting array layer EML. Potential penetration of oxygen or moisture may be prevented by the inorganic layers stacked in the encapsulation area.

The sub-area SBA may protrude from one side of the main area MA in the second direction DR2.

The (maximum) length of the sub-area SBA in the second direction DR2 may be smaller than the (maximum) length of the main area MA in the second direction DR2.

The (maximum) length/width of the sub-area SBA in the first direction DR1 may be less than or equal to the (maximum) length/width of the main area MA in the first direction DR1.

The sub-area SBA may include a connection area A1, a pad area A2, and a bending area BA.

The bending area BA may be bent. One side of the bending area BA abuts the connection area A1, and another side of the bending area BA abuts the pad area A2.

The connection area A1 is connected to the main area MA and is disposed between the non-display area NDA of the main area MA and the bending area BA.

The pad area A2 accommodates the pads PD (to which the circuit board 300 is bonded) and the display driving circuit 200.

The pads PD may be disposed in a portion of the pad area A2 close to an edge of the substrate SUB.

The circuit board 300 (illustrated in FIG. 1 and FIG. 2) may be connected to and bonded to the pads PD of the pad area A2 using a conductive adhesive member such as an anisotropic conductive film.

The display driving circuit 200 is an integrated circuit chip, may be mounted in the pad area A2, and is closer to the bending area BA than the pad PD.

FIG. 7 illustrates a portion of the sub-area SBA abutting the main area MA, a portion of the non-display area NDA, and sections of data lines, fan-out lines, power lines, and the like corresponding to a portion of each of the first display area DA1, the second display area DA2, and the fourth display area DA4 of the display area DA.

Referring to FIG. 7 and FIG. 8, the display panel 100 includes the first data lines DL1 partially disposed in a first sub-display area SDA1 of each of the first display area DA1 and the fourth display area DA4 of the display area DA and adjacent to the non-display area NDA, includes the second data lines DL2 disposed in a second sub-display area of each of the first display area DA1 and the fourth display area DA4 of the display area DA and adjacent to the second display area DA2, and includes the first data connection lines DCL1 corresponding to the first data lines DL1 and neighboring each of the second data lines DL2.

The first data lines DL1, the second data lines DL2, and the first data connection lines DCL1 extend in the same second direction DR2. The first data lines DL1, the second data lines DL2, and the first data connection lines DCL1 may be disposed directly on the same insulating layer.

The display panel 100 may further include the second data connection lines DCL2 corresponding to the first data lines DL1, respectively.

The second data connection lines DCL2 are disposed in the first display area DA1 and the fourth display area DA4 of the display area DA, and may extend in the first direction DR1, different from the extension direction of the first data lines DL1, the second data lines DL2, and the first data connection lines DCL1.

The display panel 100 may further include the first fan-out lines FL1 disposed in the non-display area NDA and corresponding to the first data lines DL1, respectively, and includes the second fan-out lines FL2 disposed in the non-display area NDA and corresponding to the second data lines DL2, respectively.

The first fan-out lines FL1 and the second fan-out lines FL2 may be disposed in both the connection area A1 of the sub-area SBA and the non-display area NDA.

The first data lines DL1 may be respectively connected to the first fan-out lines FL1 through the first data connection lines DCL1 (extending in the second direction DR2) and the second data connection lines DCL2 (extending in the first direction DR1).

The second data lines DL2 may be directly connected to the second fan-out lines FL2, respectively.

The first data lines DL1 may be respectively connected to corresponding ends of the second data connection lines DCL2 through first line contact holes LCH1.

The first data connection lines DCL1 may be respectively connected to corresponding ends of the second data connection lines DCL2 through second line contact holes LCH2.

The first data connection lines DCL1 may be respectively connected to the first fan-out lines FL1 through third line contact holes LCH3.

Accordingly, the first data lines DL1 may be respectively connected to the first fan-out lines FL1 through the first line contact holes LCH1, the second data connection lines DCL2, the second line contact holes LCH2, the first data connection lines DCL1, and the third line contact holes LCH3.

The second data lines DL2 may be respectively connected to the second fan-out lines FL2 through fourth line contact holes LCH4.

The display panel 100 may further include first power supply lines PSL1 disposed in the display area DA and supplying a first power, and may include second power supply lines PSL2 disposed in the display area DA and supplying a second power of a voltage level lower than that of the first power.

The second power supply lines PSL2 may extend in the same direction (e.g., the second direction DR2) as the first data lines DL1. The second power supply lines PSL2 may be disposed directly on the same insulating layer as the first data lines DL1.

The first data lines DL1 disposed in the first sub-display area SDA1 of each of the first display area DA1 and the fourth display area DA4 may neighbor some of the second power supply lines PSL2. The first data lines DL1 may be spaced from the neighboring second power supply line PSL2 in the first direction DR1 and may be parallel to each other.

In the first sub-display area SDA1 of each of the first display area DA1 and the fourth display area DA4, each pixel PX may be disposed between a pair of immediately neighboring first data line DL1 and second power supply line PSL2.

In the first sub-display area SDA1 of each of the first display area DA1 and the fourth display area DA4, each pixel area PX may neighbor the immediately neighboring first data line DL1 on the left side and may neighbor the immediately neighboring second power supply line PSL2 on the right side.

The second data lines DL2 disposed in the second sub-display area SDA2 of each of the first display area DA1 and the fourth display area DA4 may neighbor corresponding ones of the first data connection lines DCL1. The second data lines DL2 may be spaced from the neighboring first data connection lines DCL1 in the first direction DR1 and may be parallel to each other.

In the second sub-display area SDA2 of each of the first display area DA1 and the fourth display area DA4, each pixel PX may be disposed between a pair of immediately neighboring second data line DL2, and first data connection line DCL1.

In the second sub-display area SDA2 of each of the first display area DA1 and the fourth display area DA4, each pixel PX may neighbor the immediately neighboring second data line DL2 on the left side and neighbor the immediately neighboring first data connection line DCL1 on the right side.

The display panel 100 may further include the third data lines DL3 disposed in the second display area DA2 of the display area DA.

The first data lines DL1, the first data connection lines DCL1, and the second data connection lines DCL2 are not disposed in the second display area DA2.

In the second display area DA2, the third data lines DL3 may neighbor corresponding second power supply lines PSL2.

Each of the third data lines DL3 may be directly connected to a corresponding fan-out line.

The display panel 100 may further include a first power line PL1 and a second power line PL2 disposed in both the connection area A1 of the sub-area SBA and the non-display area NDA.

The first power line PL1 may substantially surround the periphery of the display area DA.

Although not illustrated in FIG. 7, the display panel 100 may include the first power supply lines PSL1 of FIGS. 5 and 8 extending in the first direction DR1 in the display area DA, and the first power line PL1 may be connected to the first power supply lines PSL1 of FIGS. 5 and 8.

The second power line PL2 may substantially surround the first power line PL1.

The second power supply lines PSL2 disposed in the display area DA may be connected to the second power line PL2.

The display panel 100 may further include a first bending line BL1, a second bending line BL2, a third bending line BL3, and a fourth bending line BL4 disposed in the bending area BA of the sub-area SBA, and may include a first pad line PDL1, a second pad line PDL2, a first power pad line PPL1, and a second power pad line PPL2 disposed in the pad area A2 of the sub-area SBA.

In the connection area A1 of the sub-area SBA, the first fan-out lines FL1 may be respectively connected to the first bending lines BL1 through each of fifth line contact holes LCH5.

In the connection area A1 of the sub-area SBA, the second fan-out lines FL2 may be respectively connected to the second bending lines BL2 through sixth line contact holes LCH6.

At a boundary between the connection area A1 and the bending area BA of the sub-area SBA, the first power line PL1 may be connected to the third bending line BL3.

At the boundary between the connection area A1 and the bending area BA of the sub-area SBA, the second power line PL2 may be connected to the fourth bending line BL4.

The first pad lines PDL1 and the second pad lines PDL2 disposed in the pad area A2 are connected to the display driving circuit 200.

The first bending lines BL1 may be respectively connected to the first pad lines PDL1 through seventh line contact holes LCH7.

The second bending lines BL2 may be respectively connected to the second pad lines PDL2 through eighth line contact holes LCH8.

The first power pad line PPL1 and the second power pad line PPL2 may be connected to the circuit board 300 through the pads PD of FIG. 6.

The first power pad line PPL1 may be connected to the first power line PL1 through the third bending line BL3.

The second power pad line PPL2 may be connected to the second power line PL2 through the fourth bending line BL4.

The display panel 100 according to one embodiment includes the first data connection lines DCL1 and the second data connection lines DCL2 that enable connection between the first data lines DL1 and the first fan-out lines FL1. Accordingly, the first fan-out line FL1 may not need to be parallel to the second fan-out line FL2 in the first direction DR1, and may overlap the second fan-out line FL2 in the third direction DR3.

Accordingly, the width (in the first direction DR1) of the area accommodating the first fan-out lines FL1 and the second fan-out lines FL2 in the non-display area NDA may be minimized.

Although the width of the non-display area NDA is advantageously reduced, the first fan-out lines FL1 and the second fan-out lines FL2 may still be sufficiently implemented. Accordingly, satisfactory resolution of the display panel 100 may be maintained.

Referring to FIG. 8, the first display area DA1 may include the first sub-display area SDA1 adjacent to the non-display area NDA in the first direction DR1, and may include the second sub-display area SDA2 adjacent to the second display area DA2 in the first direction DR1.

The display panel 100 includes the first data lines DL1 disposed in the first sub-display area SDA1, the second data lines DL2 disposed in the second sub-display area SDA2, and the first data connection lines DCL1 extending in the same direction as the second data lines DL2, corresponding to the first data lines DL1, and neighboring the second data line DL2.

The first data lines DL1, the second data lines DL2, and the first data connection lines DCL1 may extend in the same second direction DR2. The first data lines DL1, the second data lines DL2, and the first data connection lines DCL1 may be provided in the same pattern/material layer and may be disposed directly on the same insulating layer.

The display panel 100 may further include the second data connection lines DCL2 extending in the first direction DR1. The second data connection lines may cross first data lines DL1, second data lines DL2, and first data connection lines DCL1 and may correspond to the plurality of first data lines DL1.

Since the second data connection lines DCL2 extend in the first direction DR1, the second data connection lines DCL2 may be disposed directly on a different layer than the first data lines DL1, the second data lines DL2, and the first data connection lines DCL1.

The display panel 100 may further include first dummy line patterns DLP1 (or first dummy lines DLP1) extending in the second direction DR2 and spaced from and aligned with corresponding ones of the first data connection lines DCL1 in the second direction DR2. A side/edge of a first dummy line pattern DLP1 may be aligned with a side/edge of a corresponding first data connection line DCL1 in the second direction DR2. The first dummy line patterns DLP1 may be disposed on the same layer as the first data connection line DCL1.

The display panel 100 may further include second dummy line patterns DLP2 (or second dummy lines DLP2) extending in the first direction DR1 and spaced from and aligned with corresponding ones of each of the second data connection lines DCL2 in the first direction DR1. A side/edge of a second dummy line pattern DLP2 may be aligned with a side/edge of a corresponding second data connection line DCL2 in the first direction DR1. The second dummy line patterns DLP2 may be disposed on the same layer as the second data connection lines DCL2.

The display panel 100 may further include the first power supply lines PSL1 extending in the first direction DR1, alternating with the second data connection lines DCL2 and/or the second dummy line patterns DLP2 in the second direction DR2, and supplying the first power, and may include the second power supply lines PSL2 extending in the second direction DR2 and supplying the second power.

The first power supply lines PSL1 may be disposed on the same layer as the second data connection lines DCL2 and the second dummy line patterns DLP2.

The second power supply lines PSL2 may be disposed on the same layer as the first data lines DL1.

Some of the second power supply lines PSL2 immediately neighbor corresponding ones of the first data lines DL1, respectively.

Some of the second power supply lines PSL2 respectively immediately neighbor corresponding ones of the third data lines DL3 of FIG. 7 in the second display area DA2 and the sixth display area DA6.

The first data lines DL1 disposed in the first sub-display area SDA1 are respectively connected to corresponding ends of the second data connection lines DCL2 through the first line contact holes LCH1.

The first line contact holes LCH1 may be aligned in a second diagonal direction DD2 (or second intermediate direction DD2) in the first sub-display area SDA1. The second diagonal direction DD2 may be between the first direction DR1 and the second direction DR2.

The first data connection lines DCL1 disposed in the second sub-display area SDA2 are respectively connected to corresponding ends of the second data connection lines DCL2 through the second line contact holes LCH2.

The second line contact holes LCH2 may be aligned in the first diagonal direction DD1 (or first intermediate direction DD1) in the second sub-display area SDA2. The first diagonal direction DD1 may be between the first direction DR1 and the second direction DR2 and may be different from the second diagonal direction DD2. For example, the first diagonal direction DD1 may be a direction perpendicular to the second diagonal direction DD2.

The first data lines DL1 disposed in the first sub-display area SDA1 may be respectively connected to the first data connection lines DCL1 disposed in the second sub-display area SDA2 through the first line contact holes LCH1, the second data connection lines DCL2, and the second line contact holes LCH2.

Each of the second dummy line patterns DLP2 disposed in the first sub-display area SDA1 may be connected to one of the second power supply lines PSL2 through one of the first power contact holes PCH1.

The first power contact holes PCH1 may be aligned in the first diagonal direction DD1. An arrangement direction of the first power contact holes PCH1 may be parallel to an arrangement direction of the first line contact holes LCH1.

In this way, it may be relatively easy to detect whether the positions of the first power contact holes PCH1, the first line contact holes LCH1, and the second line contact holes LCH2 are normal based on the arrangements.

The display panel 100 includes the pixels PX arranged in the display area DA.

Each of the pixels PX disposed in the first sub-display area SDA1 may be connected to a corresponding first data line DL1 neighboring the pixel PX on one side (i.e., the left side of FIG. 8) in the first direction DR1. Each of the pixels PX disposed in the first sub-display area SDA1 may neighbor a corresponding second power supply line PSL2 on the other side (i.e., the right side of FIG. 8) in the first direction DR1.

Each of the pixels PX disposed in the second sub-display area SDA2 may be connected to a corresponding first data line DL1 neighboring the pixel PX on one side (i.e., the left side of FIG. 8) of the first direction DR1. Each of the pixels PX disposed in the second sub-display area SDA2 may neighbor a corresponding first data connection line DCL1 on the other side (i.e., the right side of FIG. 8) in the first direction DR1.

Each of the pixels PX emits light of a wavelength range corresponding to one of two or more different colors.

For example, the pixels PX may include a first pixel, a second pixel, and a third pixel corresponding to different colors. A unit pixel, which is a unit that displays various colors, may be a combination of at least one first pixel, at least one second pixel, and at least one third pixel adjacent to each other.

The first pixel may emit light in a wavelength range corresponding to red, the second pixel may emit light in a wavelength range corresponding to blue, and the third pixel may emit light in a wavelength range corresponding to green.

Referring to FIG. 2 and FIG. 8, the light emitting array layer EML of the display panel 100 may include first light emitting elements LEL1 of first pixels, second light emitting elements LEL2 of second pixels, and third light emitting elements LEL3 of third pixels.

First light emitting elements LEL1 and second light emitting elements LEL2 may be alternately disposed in the first direction DR1 and/or the second direction DR2.

The third light emitting elements LEL3 may be spaced from the first light emitting elements LEL1 and the second light emitting element LEL2 in the first diagonal direction DD1 and/or the second diagonal direction DD2.

First columns in which first light emitting elements LEL1 and second light emitting elements LEL2 are alternately arranged in the first direction DR1 and second columns in which third light emitting elements LEL3 are aligned in the first direction DR1 may alternate in the second direction DR2.

First rows in which first light emitting elements LEL1 and second light emitting elements LEL2 are alternately arranged in the second direction DR2 and a second row in which third light emitting elements LEL3 are aligned in the second direction DR2 may alternate in the first direction DR1.

FIG. 9 illustrates layouts corresponding to portion B and portion C of FIG. 8. FIG. 10 illustrates layouts and arrangements of light emitting elements corresponding to the portion B and the portion C of FIG. 8.

Referring to FIG. 9, each of the first data lines DL1, each of the second data lines DL2, and each of the first data connection lines DCL1 includes a line pattern portion LNP (or line member LNP) extending in the second direction DR2, and includes a first protrusion PRP1 and a second protrusion PRP2 connected to the line pattern portion LNP and being wider than the line pattern portion LNP in the first direction DR1. Each first protrusion PRP1 and each second protrusion PRP2 may correspond to a neighboring pixel PX.

Each of the second power supply lines PSL2 includes a line pattern portion LNP, a first protrusion PRP1, and a second protrusion PRP2, and may be substantially a mirror image of the neighboring first data line DL1.

Each of the first dummy line patterns DLP1 includes a line pattern portion LNP, a first protrusion PRP1, and a second protrusion PRP2, similar to the neighboring and aligned first data connection line DCL1.

Each line pattern portion LNP may extend in the second direction DR2.

Each of the first data lines DL1 and the second data lines DL2 may be connected to a neighboring pixel PX through transistor contact holes TCH overlapping one of a first protrusion PRP1 and a second protrusion PRP2 overlapping the pixel PX. Each of the first data lines DL1 may be connected to one end of a corresponding second data connection line DCL2 through a corresponding first line contact hole LCH1 exposing the other one of the first protrusion PRP1 and the second protrusion PRP2.

The transistor contact hole TCH is to connect the second transistor ST2 of the pixel driving unit PDU of the pixel PX to the first data line DL1 or the second data line DL2 neighboring the pixel PX.

The first line contact hole LCH1 is to enable connection between the first data line DL1 and the second data connection line DCL2.

A first data line DL1 may be connected to the pixel driver of a corresponding pixel PX through the transistor contact hole TCH exposing the second protrusion PRP2 overlapping the pixel PX. A first data line DL1 may be connected to the corresponding second data connection line DCL2 through the first line contact hole LCH1 disposed in the first protrusion PRP1 corresponding to the pixel PX.

Each first data line DL1 may overlap only one first line contact hole LCH1, which may be disposed in a first protrusion PRP1 corresponding to only one pixel PX among the pixels PX neighboring and electrically connected to the first data line DL1. Only transistor contact holes TCH, but not another first line contact hole LCH1, may overlap the remaining pixels neighboring and electrically connected to the first data line DL1.

Only one pixel PX in a pixel column neighboring and electrically connected to a first data line DL1 may overlap both of a first line contact hole LCH1 overlapping a first protrusion PRP1 of the first data line DL1 and a transistor contact hole TCH overlapping a second protrusion PRP2 of the first data line DL1.

the remaining pixels PX in the pixel column neighboring the first data line DL1 may overlap transistor contact holes TCH overlapping second protrusions PRP2 of the first data line DL1, may not overlap any first line contact holes LCH1, and may overlap flat first protrusions PRP1 of the first data line DL1.

Each of the pixels PX neighboring and connected to the same second data line DL2 may overlap a transistor contact hole TCH overlapping a second protrusion PRP2 of the second data line DL2, may not overlap any first line contact holes LCH1, and may overlap a flat first protrusion PRP1 of the second data line DL2.

Each of the first data connection lines DCL1 may be connected to the corresponding end of the corresponding second data connection line DCL2 through a second line contact hole LCH2 overlapping one of the first protrusion PRP1 and the second protrusion PRP2 overlapped by a pixel PX neighboring the first data connection line DCL1.

When a transistor contact hole TCH is disposed on the second protrusion PRP2 of each of the first data line DL1 and the second data line DL2, a first line contact hole LCH1 may overlap the first protrusion PRP1 of the first data line DL1 corresponding to a pixel PX neighboring the first data line DL1 and may enable connection between the first data line DL1 and the second data connection line DCL2. The other first protrusions of PRP1 of the first data line DL1 may not be overlapped with any first contact holes LCH1. The second line contact hole LCH2 for connection between the corresponding first data connection line DCL1 and the second data connection lines DCL2 may be disposed on (and overlapped with) a first protrusion PRP1 of the first data connection line DCL1 overlapped by a pixel PX neighboring the first data connection line DCL1.

The other first protrusions of the first data connection line DCL1 may not be overlapped with contact holes and/or may be flat. The second protrusion PRP2 of the first data connection line DCL1 overlapped by the pixel PX neighboring the first data connection line DCL1 may be flat and/or not overlapped with any contact hole.

Some of the first protrusions PRP1 and some of the second protrusions PRP2 included in the first data lines DL1, the second data lines DL2, and the first data connection lines DCL1 may be overlapped with transistor contact holes TCH, first line contact holes LCH1, and second line contact holes LCH2. The remaining protrusions PRP1 and PRP2 may be flat and/or not overlapped with contact holes.

For example, a data line DL11 among the first data lines DL1 may be connected to a second data connection line DCL21 through the first line contact hole LCH1 overlapping (and exposing) the first protrusion PRP1 of the data line DL11 corresponding to a pixel PX neighboring the data line DL11.

A first data connection line DCL11 corresponding to the data line DL11 and neighboring a second data line DL2 may be connected to the second data connection line DCL21 through the second line contact hole LCH2 overlapping (and exposing) the first protrusion PRP1 of the first data connection line DCL11 corresponding to a pixel PX neighboring the first data connection line DCL11.

A data line DL12 among the first data lines DL1 may be connected to another second data connection line DCL22 through the first line contact hole LCH1 overlapping the first protrusion PRP1 of the data line DL12 corresponding to a pixel PX neighboring the data line DL12.

Another first data connection line DCL12 corresponding to the data line DL12 and neighboring another second data line DL2 may be connected to the second data connection line DCL22 through the second line contact hole LCH2 overlapping the first protrusion PRP1 of the first data connection line DCL12 corresponding to a pixel PX neighboring the first data connection line DCL12.

Among the first protrusions PRP1 included in the first data lines DL1, the second data lines DL2, the first data connection lines DCL1, the second power supply lines PSL2, and the first dummy line patterns DLP1, some of the first protrusions PRP1 corresponding to (and overlapped by) pixels PX aligned in the first direction DR1 are aligned with each other in the first direction DR1.

Among the second protrusions PRP2 included the first data lines DL1, the second data lines DL2, the first data connection lines DCL1, the second power supply lines PSL2, and the first dummy line patterns DLP1, some of the second protrusions PRP2 corresponding to (and overlapped by) pixels PX aligned in the first direction DR1 are aligned with each other in the first direction DR1.

Two of the lines extending in the second direction DR2 and immediately neighboring each other may be mirror images of each other.

The first data lines DL1 and the second power supply lines PSL2 disposed in the first sub-display area SDA1 may be mirror images of each other for each pair of one first data line DL1 and one second power supply line PSL2 that immediately neighbor.

In the second sub-display area SDA2, a section of a second data line DL2 and an immediately neighboring first data connection line DCL1 or first dummy line pattern DLP1 may be mirror images of each other.

The substantially symmetrical structures of the first protrusions PRP1 and the second protrusions PRP2 may optimize the quality of displayed images.

Referring to FIG. 10, the light emitting array layer EML may include first light emitting elements LEL1 of first pixels for emitting light of a first color, second light emitting elements LEL2 of second pixels for emitting light of a second color, and third light emitting element LEL3 of third pixels for emitting light of a third color.

Each first light emitting element LEL1 may overlap one pair of first protrusions PRP1 neighboring each other and may overlap one pair of second protrusions PRP2 neighboring each other. Each second light emitting element LEL2 may overlap another pair of first protrusions PRP1 neighboring each other and may overlap another pair of second protrusions PRP2 neighboring each other.

Each third light emitting element LEL3 may overlap two line pattern portions LNP.

Third light emitting elements LEL3 may be aligned in the first direction DR1 and the second direction DR2.

Since the first light emitting element LEL1 of all the first pixels and the second light emitting element LEL2 of all the second pixels substantially identically overlap a pair of first protrusions PRP1 and a pair of second protrusions PRP2, the uniformity in the light emission direction of all the first pixels and the uniformity in the light emission direction of all the second pixels may be satisfactory.

Since the third light emitting elements LEL3 of all third pixels substantially identically overlap portions of two line pattern portions LNP, the uniformity in the light emission direction of all third pixels may be satisfactory.

Most of the light emitted from the pixels PX may be emitted toward the front side of the display panel 100.

Accordingly, color differences according to the field of view and/or viewing angles may be minimized. Advantageously, the quality of images displayed by the display panel 100 may be satisfactory.

Structures of the fourth display area DA4 may be mirror images of structures of the first display area DA1 with respect to the second display area DA2 and can be understood from the above description related to the first display area DA1.

FIG. 11 illustrates a layout corresponding to a portion of the second display area DA2 of FIG. 6 according to an embodiment.

Referring to FIG. 11, the display panel 100 may further include the third data lines DL3 disposed in the second display area DA2 and extending in the second direction DR2. The third data lines DL3 may be directly connected to the fan-out lines.

Some second power supply lines PSL2 may neighbor the third data lines DL3, respectively.

Each of the third data lines DL3, similar to the neighboring second power supply line PSL2, may include a line pattern portion LNP extending in the second direction DR2, and may include a first protrusion PRP1 and a second protrusion PRP2 protruding from the line pattern portion LNP in the first direction DR1.

Each third data lines DL3 and the immediately neighboring second power supply lines PSL2 may be mirror images of each other.

The first power supply lines PSL1 (extending in the first direction DR1) and the second dummy line patterns DLP2 (extending in the first direction DR1 and alternating with the first power supply lines PSL1 in the second direction DR2) are partially disposed in the second display area DA2.

Each of the second dummy line patterns DLP2 may be connected to a second power supply line PSL2 through one of the first power contact holes PCH1.

In the second display area DA, first power contact holes PCH1 may be aligned in the first diagonal direction DD1 or the second diagonal direction DD2.

Structures of the sixth display area DA6 are similar to structures of the second display area DA2 and can be understood from the above description related to the second display area DA2.

FIG. 12 illustrates a layout corresponding to a portion of the third display area DA3 of FIG. 6 according to an embodiment.

Referring to FIG. 12, the third display area DA3 may include a third sub-display area SDA3 adjacent to the non-display area NDA in the first direction DR1, and may include a fourth sub-display area SDA4 adjacent to the sixth display area DA6 in the first direction DR1.

The first data connection lines DCL1 and the second data connection lines DCL2 are not disposed in the third display area DA3. The third display area DA3 extends from the first display area DA1 in the second direction DR2, and in the first display area DA1, the first data lines DL1 are connected to the first data connection lines DCL1, respectively; therefore, there is no need to redundantly dispose the first data connection line DCL1 in the third display area DA3.

In the third display area DA3, first power supply lines PSL1 and second dummy line patterns DLP2 may extend in the first direction DR1, and be alternately disposed in the second direction DR2.

In the fourth sub-display area SDA4 of the third display area DA3, second data lines DL2 and first dummy line patterns DLP1 may neighbor each other.

The third sub-display area SDA3 of the third display area DA3 may include sections of first data lines DL1, sections of second power supply line PSL2, and first power contact holes PCH1 for connecting second dummy line patterns DLP2 to second power supply line PSL2 may be disposed. Each of the second dummy line patterns DLP2 may be connected to a second power supply line PSL2 through one of the first power contact holes PCH1.

In the third sub-display area SDA3, first power contact holes PCH1 may be aligned in the first diagonal direction DD1 or the second diagonal direction DD2.

In the third sub-display area SDA3, first power contact holes PCH1 may be aligned in the second diagonal direction DD2 and/or the first diagonal direction DD1 and may be aligned in the second direction DR2. Geometric lines connecting first power contact holes PCH1 in the third sub-display area SDA3 may extend in the second diagonal direction DD2 and/or in the first diagonal direction DD1 and may be parallel to or at an angle to (e.g., perpendicular to) each other.

Second power contact holes PCH2 for connecting first dummy line patterns DLP1 to second dummy line patterns DLP2 may be disposed in the fourth sub-display area SDA4.

The second dummy line patterns DLP2 may be respectively connected to the first dummy line patterns DLP1 through the second power contact holes PCH2.

In the fourth sub-display area SDA4, second power contact holes PCH2 may be aligned in the first diagonal direction DD1 and/or the second diagonal direction DD2 and may be aligned in the second direction DR2.

In the fourth sub-display area SDA4, geometric lines connecting second power contact holes PCH2 may be mirror images of geometric lines connecting first power contact holes PCH1 in the third sub-display area SDA3. Positions of the second power contact hole PCH2 in the fourth sub-display area SDA4 may be mirror images of positions of the first power contact hole PCH1 in the third sub-display area SDA3.

Based on the above-described structure, whether the positions of the first power contact holes PCH1 and the second power contact holes PCH2 are normal may be detected relatively easily.

Each of the second power supply lines PSL2 and the first dummy line patterns DLP1 may include a line pattern portion LNP, a first protrusion PRP1, and a second protrusion PRP2.

Each of the second power supply lines PSL2 may be connected to a second dummy line pattern DLP2 through the first power contact hole PCH1 overlapping one of the first protrusion PRP1 and the second protrusion PRP2 corresponding to a pixel PX neighboring the second power supply line PSL2.

Each of the first dummy line patterns DLP1 may be connected to a second dummy line pattern DLP2 through the second power contact hole PCH2 overlapping one of the first protrusion PRP1 and the second protrusion PRP2 corresponding to a pixel PX neighboring the first dummy line pattern DLP1.

Some of the first protrusions PRP1 and some of the second protrusions PRP2 included in the second power supply lines PSL2 and the first dummy line patterns DLP1 may be overlapped with first power contact holes PCH1 and second power contact holes PCH2, and the remaining protrusions PRP1 and PRP2 may be flat and/or not overlapped with contact holes.

Some of the first protrusions PRP1 and some of the second protrusions PRP2 included in the first data lines DL1, the second data lines DL2, the third data lines DL3, the first data connection lines DCL1, the second power supply lines PSL2, and the first dummy line patterns DLP1 may be overlapped with transistor contact holes TCH, first line contact holes LCH1, second line contact holes LCH2, first power contact holes PCH1, and second power contact holes PCH2, and the remaining protrusions PRP1 and PRP2 may be flat and/or not overlapped with contact holes.

Structures of the fifth display area DA5 may substantially be mirror images of structures of the third display area DA3 and can be understood from the above description related to the third display area DA3.

Figure 13:
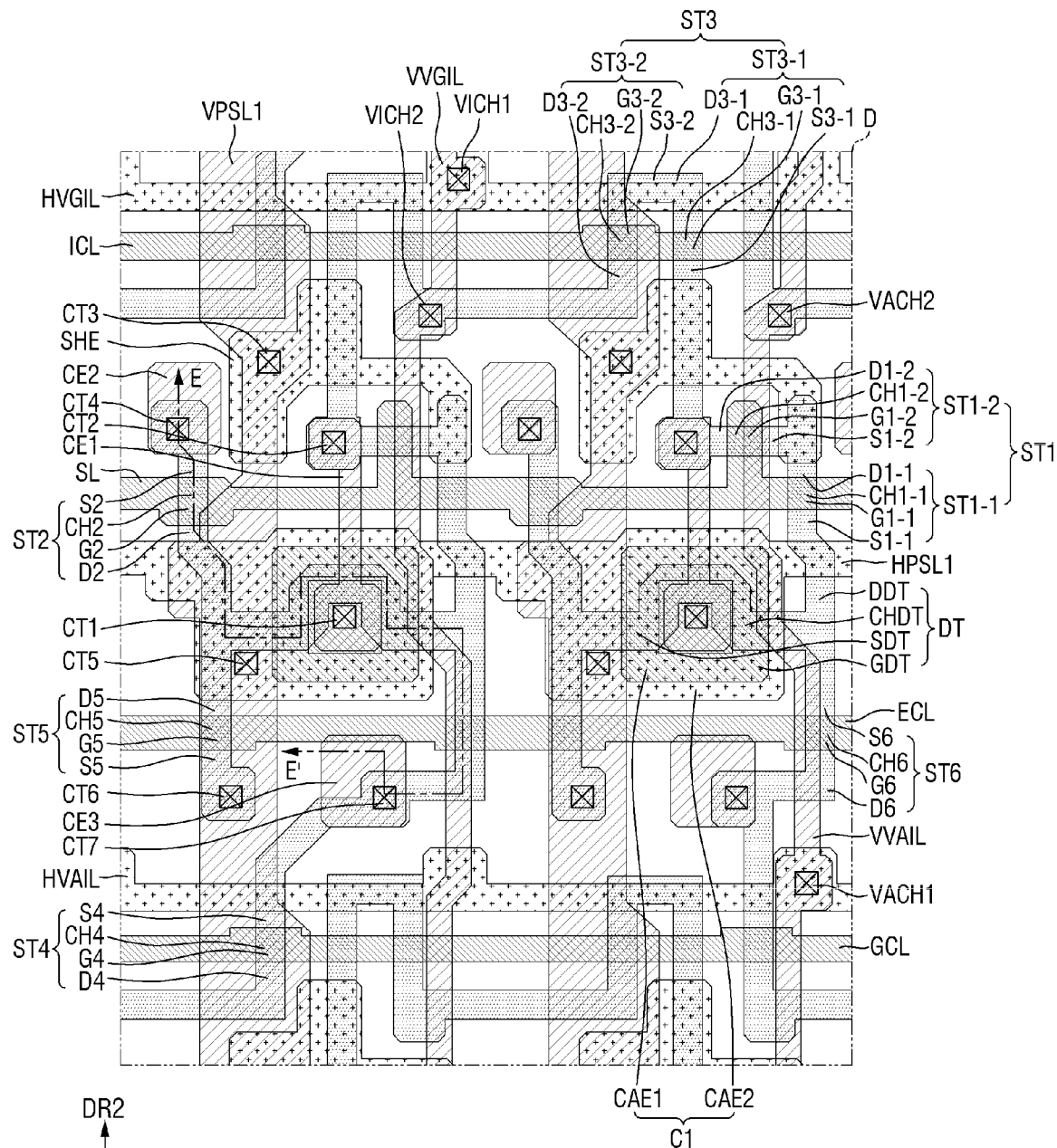
Figure 14:
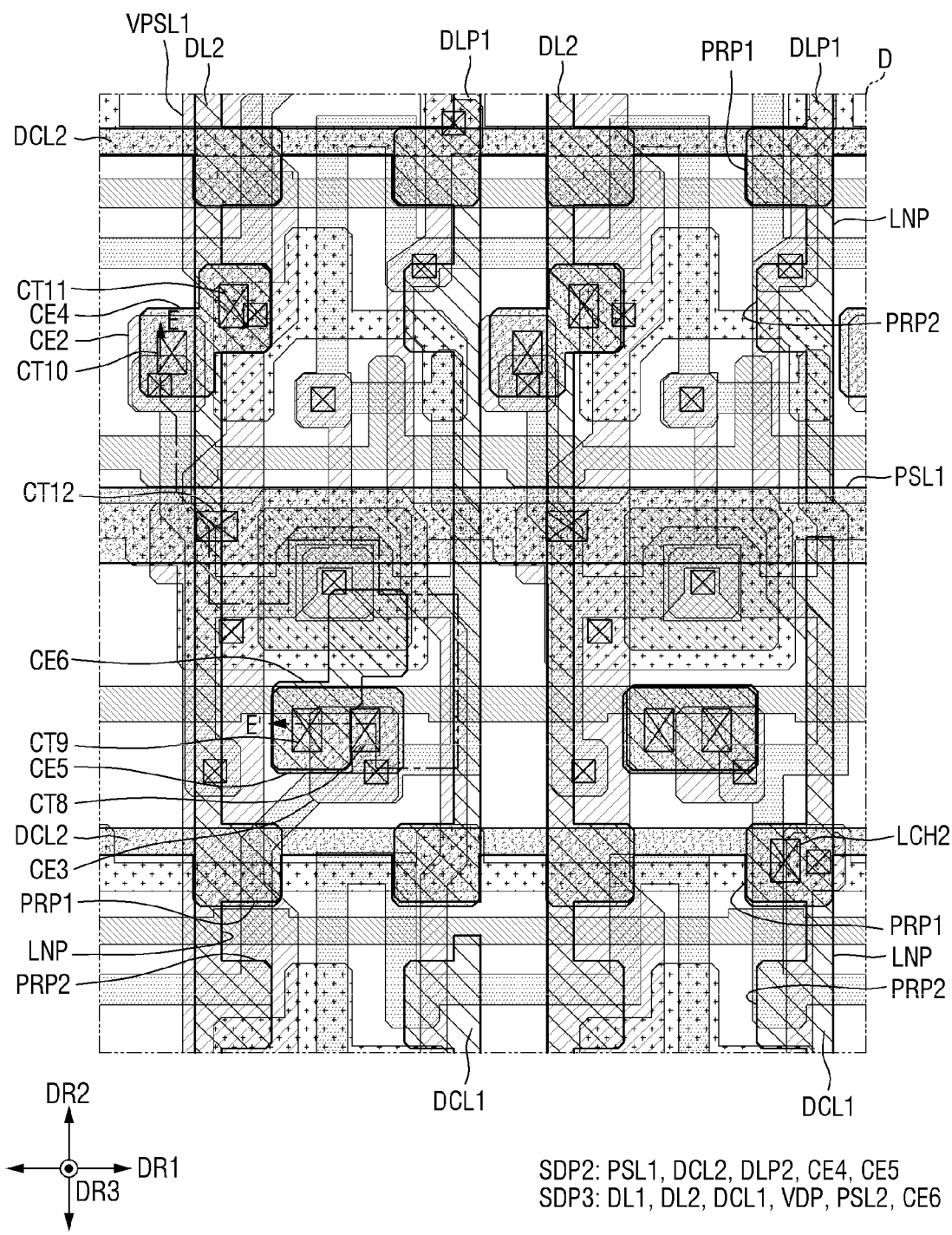
FIG. 14 illustrates a layout corresponding to portion D of FIG. 8 according to an embodiment.

Each of FIGS. 13 and 14 illustrates layouts corresponding to portion D of FIG. 8 according to an embodiment.

FIGS. 13 and 14 correspond to the pixel driving unit PDU of FIG. 4, illustrate a second data line DL2 and a first dummy line pattern DLP1 neighboring each other, and illustrate two pixels disposed on opposite sides of the second data line DL2 and the first dummy line pattern DLP1.

As described above with reference to FIG. 4, the pixel driving unit PDU of a pixel PX may be connected to a scan line SL, a gate control line GCL, an initialization control line ICL, an emission control line ECL, a first power supply line PSL1, a data line DL, a gate initialization voltage line VGIL, and an anode initialization voltage line VAIL, and may include a driving transistor DT, first to sixth transistors ST1 to ST6, and a capacitor C1.

As described above with reference to FIGS. 7 to 12, the data lines DL may include a first data line DL1 connected to a first fan-out line FL1 of the non-display area NDA through a first data connection line DCL1 and a second data connection line DCL2, and may include a second data line DL2 and a third data line DL3 respectively directly connected to fan-out lines disposed in the non-display area NDA.

The display panel 100 may further include a first dummy line pattern DLP1 extending in the second direction DR2, aligned with the first data connection line DCL1 and spaced from at least one end of the first data connection line DCL1 in the second direction DR2, and may include the second dummy line pattern DLP2 extending in the first direction DR1, aligned with the second data connection line DCL2, and spaced from at least one end of the second data connection line DCL2 in the first direction DR1. Second dummy line patterns DLP2 may be alternately disposed in the second direction DR2 with first power supply lines PSL1 extending in the first direction DR1.

Unwanted visibility of the first data connection line DCL1 and the second data connection line DCL2 may be lowered by the first dummy line pattern DLP1 and the second dummy line pattern DLP2.

The second dummy line pattern DLP2 may be connected to a second power supply line PSL2 through a first power contact hole PCH1, and may be connected to the first dummy line pattern DLP1 through the second power contact hole PCH2.

Referring to FIGS. 13 and 14, the display panel 100 includes a semiconductor pattern layer SEP, a first gate pattern layer GTP1, a second gate pattern layer GTP2, a first source/drain pattern layer SDP1, a second source/drain pattern layer SDP2, and a third source/drain pattern layer SDP3.

Referring to FIG. 13, the scan line SL, the gate control line GCL, the initialization control line ICL, and the emission control line ECL extend in the first direction DR1 and are spaced from each other in the second direction DR2.

The scan line SL, the gate control line GCL, the initialization control line ICL, and the emission control line ECL may be provided in the same layer. For example, the scan line SL, the gate control line GCL, the initialization control line ICL, and the emission control line ECL may be formed in the first gate pattern layer GTP1.

The gate initialization voltage line VGIL (indicated in FIG. 4) may include a gate initialization horizontal line HVGIL extending in the first direction DR1 and a gate initialization vertical line VVGIL extending in the second direction DR2.

The gate initialization horizontal line HVGIL may be formed in the second gate pattern layer GTP2. The gate initialization vertical line VVGIL may be formed in the first source/drain pattern layer SDP1.

The gate initialization vertical line VVGIL may be connected to the gate initialization horizontal line HVGIL through a first initialization contact hole VICH1.

The anode initialization voltage line VAIL (indicated in FIG. 4) may include an anode initialization horizontal line HVAIL extending in the first direction DR1 and an anode initialization vertical line VVAIL extending in the second direction DR2.

The anode initialization horizontal line HVAIL may be formed in the second gate pattern layer GTP2. The anode initialization vertical line VVAIL may be formed in the first source/drain pattern layer SDP1.

The anode initialization vertical line VVAIL may be connected to the anode initialization horizontal line HVAIL through the third initialization contact hole VACH1.

The display panel 100 may further include a first power supply auxiliary line HPSL1 extending in the first direction DR1 and a first power supply vertical line VPSL1 extending in the second direction DR2.

The first power supply auxiliary line HPSL1 may be formed in the second gate pattern layer GTP2, and the first power supply vertical line VPSL1 may be formed in the first source/drain pattern layer SDP1. The first power supply line PSL1 (extending in the first direction DR1) may be formed in the second source/drain pattern layer SDP2.

The first power supply vertical line VPSL1 may be connected to the first power supply auxiliary line HPSL1 through a fifth contact hole CT5 of FIG. 13.

The first power supply line PSL1 may be connected to the first power supply vertical line VPSL1 through a twelfth contact hole CT12 of FIG. 14.

In each of the first display area DA1 and the fourth display area DA4, the first power supply lines PSL1 (extending in the first direction DR1) are alternately disposed in the second direction DR2 with second data connection lines DCL2 (extending in the first direction DR1).

At least one side of a first data connection line DCL2 extending in the first direction DR1 neighbors a second dummy line pattern DLP2 in the first direction DR1.

First power supply lines PSL1 are alternately disposed with second data connection lines DCL2 and/or second dummy line patterns DLP2 in the second direction DR2.

The second data connection line DCL2 and the second dummy line pattern DLP2 may be formed in the second source/drain pattern layer SDP2.

In the second sub-display area SDA2, the second data lines DL2 (extending in the second direction DR2) are alternately disposed in the first direction DR1 with the first data connection lines DCL1 (extending in the second direction DR2).

At least one side of a first data connection line DCL1 (extending in the second direction DR2) neighbors a first dummy line pattern DLP1 (extending in the second direction DR2).

Second data lines DL2 are alternately disposed with the combination of first data connection lines DCL1 and first dummy line patterns DLP1 in the first direction DR1.

The first data line DL1, the second data line DL2, the first data connection line DCL1, and the first dummy line pattern DLP1 may be formed in the third source/drain pattern layer SDP3.

As illustrated in FIG. 13, the driving transistor DT may include a channel portion CHDT, a source electrode SDT and a drain electrode DDT connected to opposite sides of the channel portion CHDT, and a gate electrode GDT overlapping the channel portion CHDT.

The source electrode SDT of the driving transistor DT may be connected to a drain electrode D2 of the second transistor ST2 and a drain electrode D5 of the fifth transistor ST5.

The drain electrode DDT of the driving transistor DT may be connected to a source electrode S1-1 of a first-first transistor ST1-1 and a source electrode S6 of the sixth transistor ST6.

The channel portion CHDT, the source electrode SDT, and the drain electrode DDT of the driving transistor DT may be formed in the semiconductor pattern layer SEP. The source electrode SDT and the drain electrode DDT may be conductive portions of the semiconductor pattern layer SEP formed by doping a semiconductor material with ions or impurities.

The gate electrode GDT of the driving transistor DT may be formed in the first gate pattern layer GTP1.

The first transistor ST1 may include a first-first transistor ST1-1 and a first-second transistor ST1-2 that are interconnected.

The first-first transistor ST1-1 may include a channel portion CH1-1, a source electrode S1-1 and a drain electrode D1-1 connected to opposite sides of the channel portion CH1-1, and a gate electrode G1-1 overlapping the channel portion CH1-1 and being a portion of the scan line SL.

The source electrode S1-1 of the first-first transistor ST1-1 may be connected to the drain electrode DDT of the driving transistor DT.

The drain electrode D1-1 of the first-first transistor ST1-1 may be connected to a source electrode S1-2 of the first-second transistor ST1-2.

The first-second transistor ST1-2 may include a channel portion CH1-2, a source electrode S1-2 and a drain electrode D1-2 connected to two sides of the channel portion CH1-2, and a gate electrode G1-2 overlapping the channel portion CH1-2 and being a protrusion of the scan line SL.

The source electrode S1-2 of the first-second transistor ST1-2 may be connected to the drain electrode D1-1 of the first-first transistor ST1-1.

The drain electrode D1-2 of the first-second transistor ST1-2 may be connected to a source electrode S3-1 of a third-first transistor ST3-1.

The channel portion CH1-1, the source electrode S1-1, and the drain electrode D1-1 of the first-first transistor ST1-1, and the channel portion CH1-2, the source electrode S1-2, and the drain electrode D1-2 of the first-second transistor ST1-2 may be formed in the semiconductor pattern layer SEP. The source electrodes S1-1 and S1-2 and the drain electrodes D1-1 and D1-2 of each of the first-first transistor ST1-1 and the first-second transistor ST1-2 may be conductive portions of the semiconductor pattern layer SEP formed by doping a semiconductor material with ions or impurities.

The gate electrodes G1-1 and G1-2 of each of the first-first transistor ST1-1 and the first-second transistor ST1-2 may be formed in the first gate pattern layer GTP1.

The gate electrode GDT of the driving transistor DT may be connected to the first connection electrode CE1 through the first contact hole CT1. The first connection electrode CE1 may be connected to the drain electrode D1-2 of the first-second transistor ST1-2 through the second contact hole CT2.

The first connection electrode CE1 may be formed in the first source/drain pattern layer SDP1.

The second transistor ST2 may include a channel portion CH2, a source electrode S2 and a drain electrode D2 connected to two sides of the channel portion CH2, and a gate electrode G2 overlapping the channel portion CH2 and being another portion of the scan line SL.

The source electrode S2 of the second transistor ST2 may be connected to a second connection electrode CE2 through a fourth contact hole CT4.

The drain electrode D2 of the second transistor ST2 may be connected to the source electrode SDT of the driving transistor DT and the drain electrode D5 of the fifth transistor ST5.

The channel portion CH2, the source electrode S2, and the drain electrode D2 of the second transistor ST2 may be formed in the semiconductor pattern layer SEP. The source electrode S2 and the drain electrode D2 may conductive portions of the semiconductor pattern layer SEP formed by doping a semiconductor material with ions or impurities.

The gate electrode G2 of the second transistor ST2 may be part of the first gate pattern layer GTP1.

The second connection electrode CE2 may be part of the first source/drain pattern layer SDP1.

The third transistor ST3 may include a third-first transistor ST3-1 and a third-second transistor ST3-2 that are interconnected.

The third-first transistor ST3-1 may include a channel portion CH3-1, a source electrode S3-1 and a drain electrode D3-1 connected to two sides of the channel portion CH3-1, and a gate electrode G3-1 overlapping the channel portion CH3-1.

The gate electrode G3-1 of the third-first transistor ST3-1 may be a portion of the initialization control line ICL.

The source electrode S3-1 of the third-first transistor ST3-1 may be connected to the drain electrode D1-2 of the first-second transistor ST1-2.

The drain electrode D3-1 of the third-first transistor ST3-1 may be connected to a source electrode S3-2 of the third-second transistor ST3-2.

The third-second transistor ST3-2 may include a channel portion CH3-2, a source electrode S3-2 and a drain electrode D3-2 connected to two sides of the channel portion CH3-2, and a gate electrode G3-2 overlapping the channel portion CH3-2.

The gate electrode G3-2 of the third-second transistor ST3-2 may be another portion of the initialization control line ICL.

The source electrode S3-2 of the third-second transistor ST3-2 may be connected to the drain electrode D3-1 of the third-first transistor ST3-1.

The drain electrode D3-2 of the third-second transistor ST3-2 may be connected to the gate initialization vertical line VVGIL through a second initialization contact hole VICH2.

The channel portion CH3-1, the source electrode S3-1, and the drain electrode D3-1 of the third-first transistor ST3-1, and the channel portion CH3-2, the source electrode S3-2, and the drain electrode D3-2 of the third-second transistor ST3-2 may be formed in the semiconductor pattern layer SEP. The source electrodes S3-1 and S3-2 and the drain electrodes D3-1 and D3-2 of each of the third-first transistor ST3-1 and the third-second transistor ST3-2 may be conductive portions of the semiconductor pattern layer SEP formed by doping a semiconductor material with ions or impurities.

The gate electrodes G3-1 and G3-2 of each of the third-first transistor ST3-1 and the third-second transistor ST3-2 may be formed in the first gate pattern layer GTP1.

At least a portion of the source electrode S3-2 of the third-second transistor ST3-2 may overlap the first power supply vertical line VPSL1.

The display panel 100 may further include a shielding electrode SHE overlapping at least a portion of the source electrode S3-1 of the third-second transistor ST3-2.

The shielding electrode SHE may be connected to the first power supply vertical line VPSL1 through a third contact hole CT3.

The shielding electrode SHE may further overlap a portion of the drain electrode D1-1 of the first-first transistor ST1-1.

The shielding electrode SHE may be part of a second gate pattern layer GTP2.

The first power supply vertical line VPSL1 may be connected to a first power supply auxiliary line HPSL1 through a fifth contact hole CT5.

The fourth transistor ST4 may include a channel portion CH4, a source electrode S4 and a drain electrode D4 connected to two sides of the channel portion CH4, and a gate electrode G4 overlapping the channel portion CH4 and being a portion of the gate control line GCL.

The source electrode S4 of the fourth transistor ST4 may be connected to a drain electrode D6 of the sixth transistor ST6.

The drain electrode D4 of the fourth transistor ST4 may be connected to the anode initialization vertical line VVAIL through a fourth initialization contact hole VACH2.

The channel portion CH4, the source electrode S4, and the drain electrode D4 of the fourth transistor ST4 may be formed in the semiconductor pattern layer SEP. The source electrode S4 and the drain electrode D4 may be conductive portions of the semiconductor pattern layer SEP formed by doping a semiconductor material with ions or impurities.

The gate electrode G4 of the fourth transistor ST4 may be formed of the first gate pattern layer GTP1.

The fifth transistor ST5 may include a channel portion CH5, a source electrode S5 and a drain electrode D5 connected to two sides of the channel portion CH5, and a gate electrode G5 overlapping the channel portion CH5 and formed of a portion of the emission control line ECL.

The source electrode S5 of the fifth transistor ST5 may be connected to the first power supply vertical line VPSL1 through a sixth contact hole CT6.

The drain electrode D5 of the fifth transistor ST5 may be connected to the source electrode SDT of the driving transistor DT.

The channel portion CH5, the source electrode S5, and the drain electrode D5 of the fifth transistor ST5 may be formed of the semiconductor pattern layer SEP. The source electrode S5 and the drain electrode D5 may be conductive portions of the semiconductor pattern layer SEP formed by doping a semiconductor material with ions or impurities.

The gate electrode G5 of the fifth transistor ST5 may be part of the first gate pattern layer GTP1.

The sixth transistor ST6 may include a channel portion CH6, a source electrode S6 and a drain electrode D6 connected to two sides of the channel portion CH6, and a gate electrode G6 overlapping the channel portion CH6 and being another portion of the emission control line ECL.

The source electrode S6 of the sixth transistor ST6 may be connected to the drain electrode DDT of the driving transistor DT.

The drain electrode D6 of the sixth transistor ST6 may be connected to the source electrode S4 of the fourth transistor ST4, and may be connected to the third connection electrode CE3 through the seventh contact hole CT7.

The channel portion CH6, the source electrode S6, and the drain electrode D6 of the sixth transistor ST6 may be formed in the semiconductor pattern layer SEP. The source electrode S6 and the drain electrode D6 may be conductive portions of the semiconductor pattern layer SEP formed by doping a semiconductor material with ions or impurities.

The gate electrode G6 of the sixth transistor ST6 may be part of the first gate pattern layer GTP1.

The third connection electrode CE3 may be part of the first source/drain pattern layer SDP1.

The capacitor C1 may include an overlapping structure of a first capacitor electrode CAE1 and a second capacitor electrode CAE2. The first capacitor electrode CAE1 may be a portion of the gate electrode GDT of the driving transistor DT. The second capacitor electrode CAE2 may be a portion of the first power supply auxiliary line HPSL1.

With reference to the illustration of FIG. 13, the second connection electrode CE2 is connected to the source electrode S2 of the second transistor ST2 through the fourth contact hole CT4.

As illustrated in FIG. 14, the fourth connection electrode CE4 may be connected to the second connection electrode CE2 through the tenth contact hole CT10.

The second data line DL2 may be connected to the fourth connection electrode CE4 through an eleventh contact hole CT11.

The source electrode S2 of the second transistor ST2 may be connected to the second data line DL2 through the second connection electrode CE2 and the fourth connection electrode CE4.

The fourth connection electrode CE4 may be part of the second source/drain pattern layer SDP2, and the second data line DL2 may be part of the third source/drain pattern layer SDP3.

The first power supply line PSL1 in the first direction DR1 may be connected to the first power supply vertical line VPSL1 in the second direction DR2 through the twelfth contact hole CT12.

The first power supply line PSL1 may be part of the second source/drain pattern layer SDP2, and the first power supply vertical line VPSL1 may be part of the first source/drain pattern layer SDP1.

With reference to the illustration of FIG. 13, the third connection electrode CE3 is connected to the source electrode S4 of the fourth transistor ST4 and the drain electrode D6 of the sixth transistor ST6 through the seventh contact hole CT7.

As illustrated in FIG. 14, the fifth connection electrode CE5 may be connected to the third connection electrode CE3 through an eighth contact hole CT8.

The sixth connection electrode CE6 may be connected to the fifth connection electrode CE5 through a ninth contact hole CT9.

The fifth connection electrode CE5 may be part of the second source/drain pattern layer SDP2, and the sixth connection electrode CE6 may be part of the third source/drain pattern layer SDP3.

The sixth connection electrode CE6 may be connected to the source electrode S4 of the fourth transistor ST4 and the drain electrode D6 of the sixth transistor ST6 through the third connection electrode CE5 and the fifth connection electrode CE5.

The sixth connection electrode CE6 may be connected to the anode electrode of the light emitting element LEL.

The first data connection line DCL1 may be connected to the second data connection line DCL2 through the second line contact hole LCH2.

The second data connection line DCL2 may be part of the second source/drain pattern layer SDP2, and the first data connection line DCL1 may be part of the third source/drain pattern layer SDP3.

Figure 15:
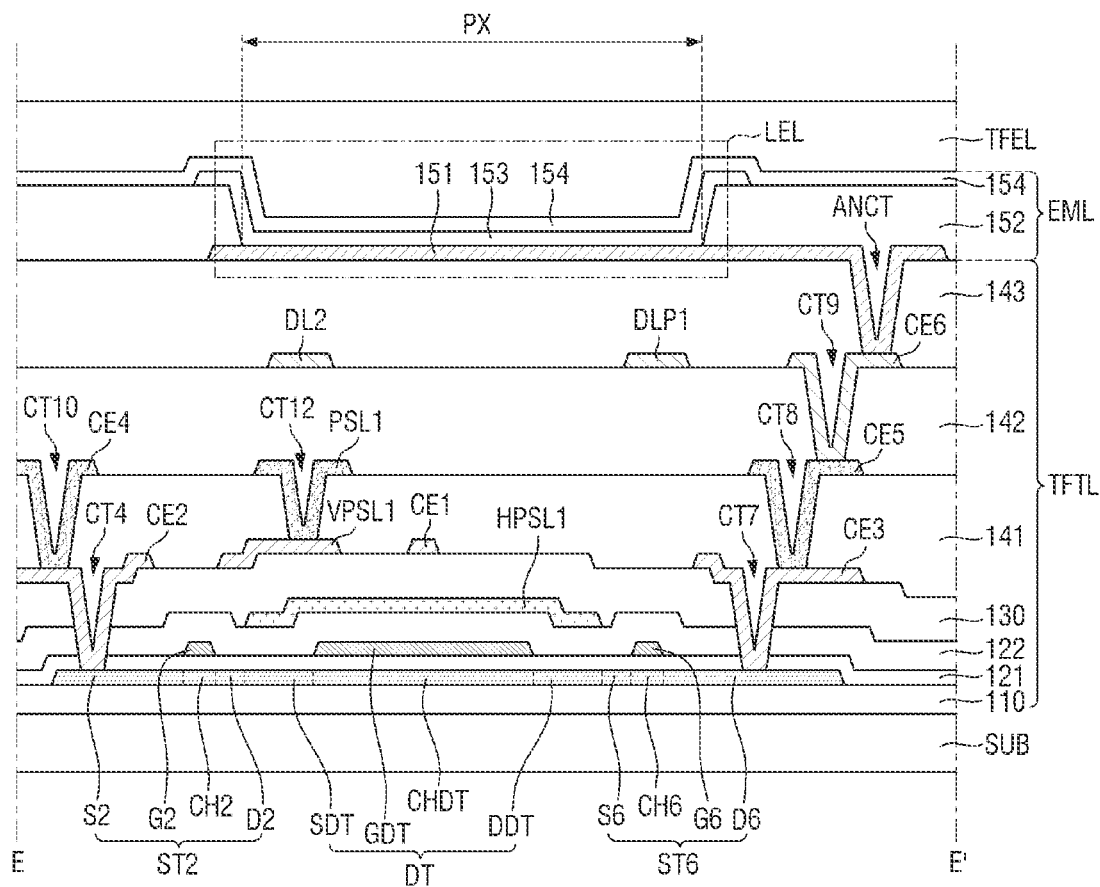
FIG. 15 illustrates a cross section corresponding to the line E-E' of FIG. 13 or FIG. 14 according to an embodiment.
Figure 17:
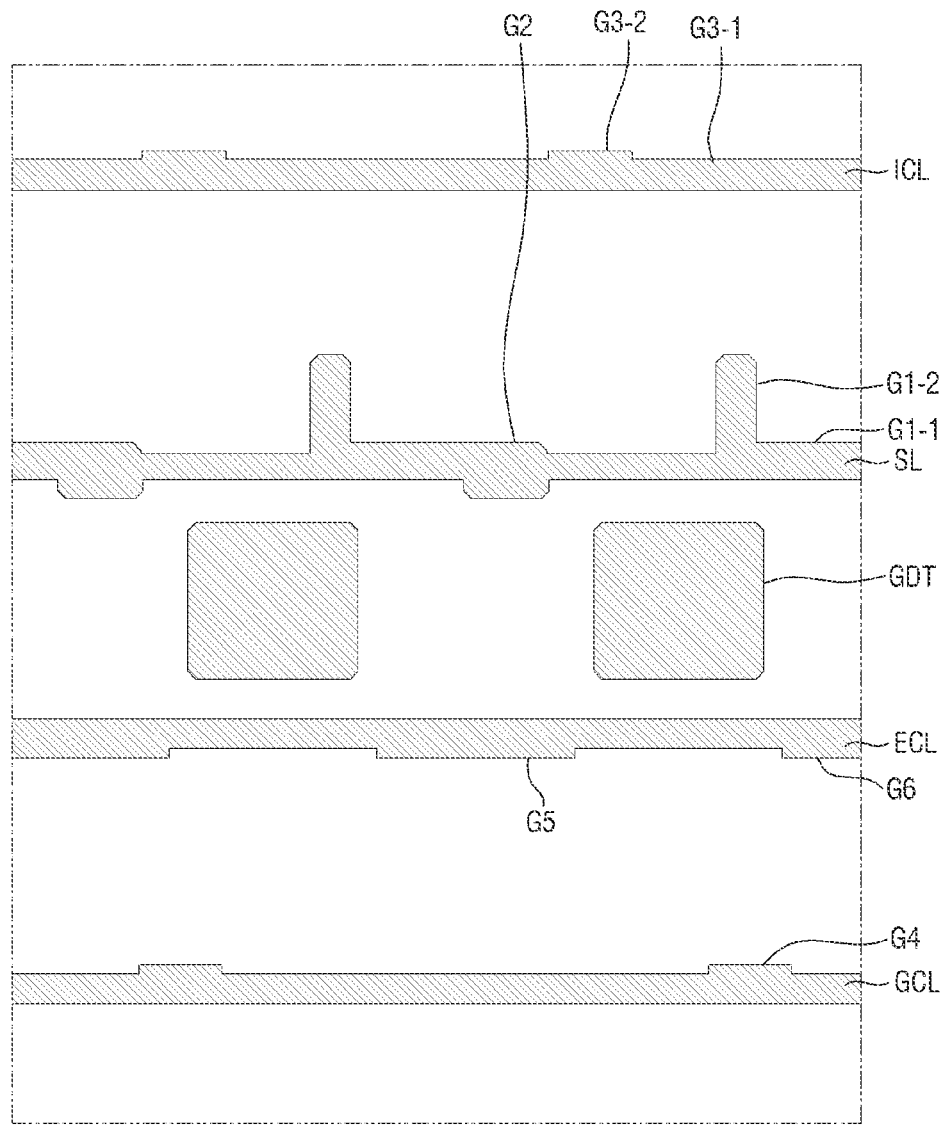
FIG. 17 illustrates the first gate pattern layer of FIG. 13 according to an embodiment.
Figure 18:
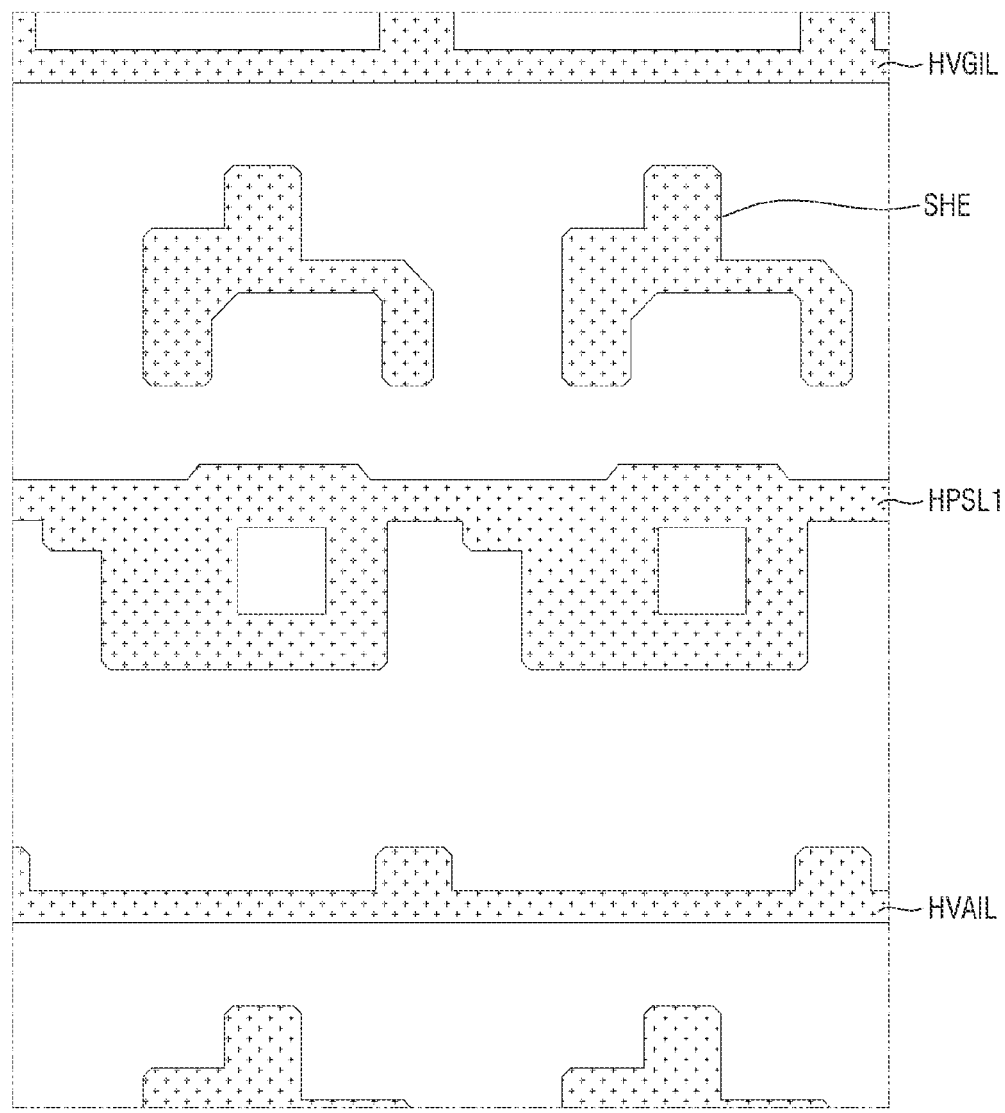
FIG. 18 illustrates the second gate pattern layer of FIG. 13 according to an embodiment.
Figure 19:
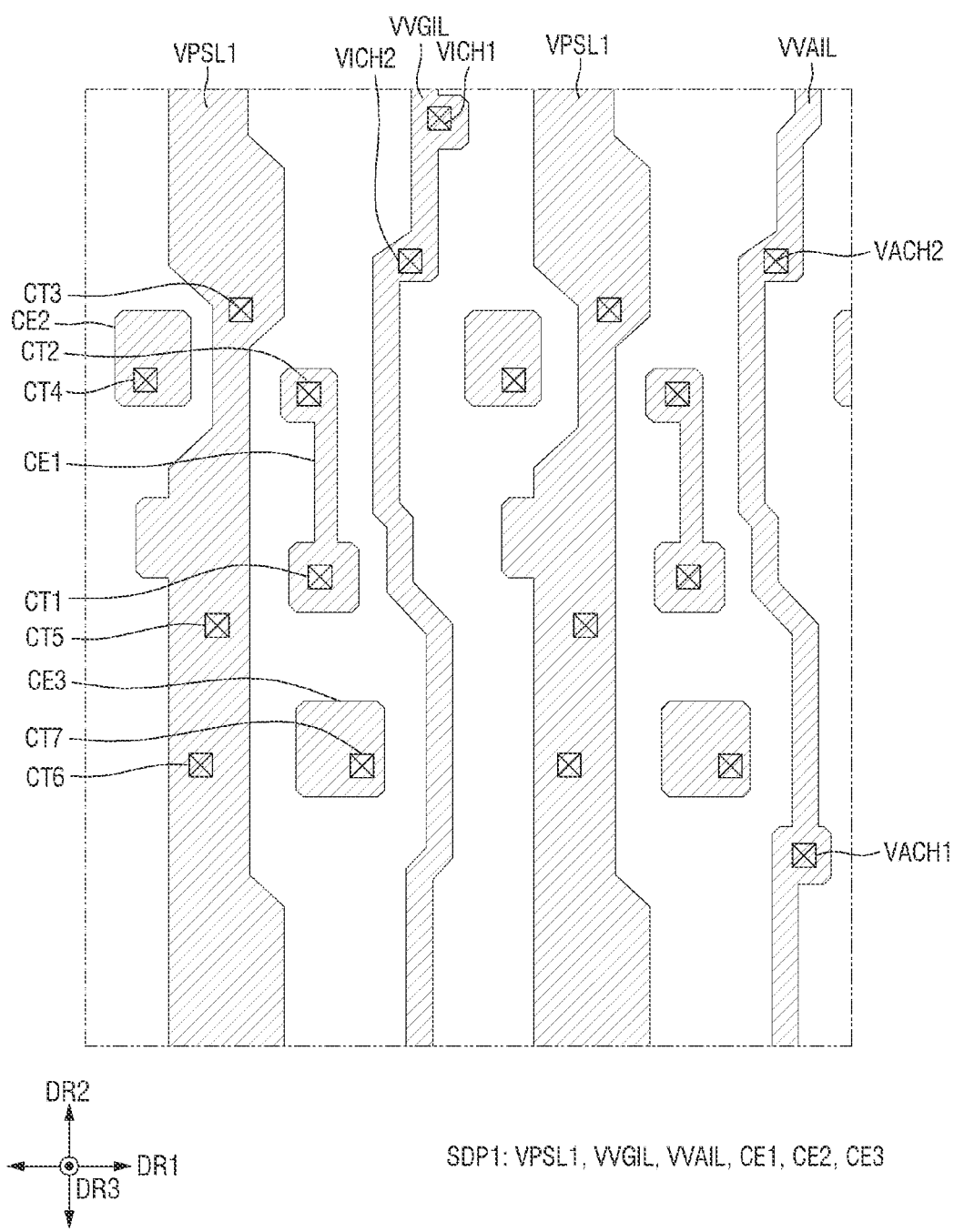
FIG. 19 illustrates the first source/drain pattern layer of FIG. 13 according to an embodiment.
Figure 20:
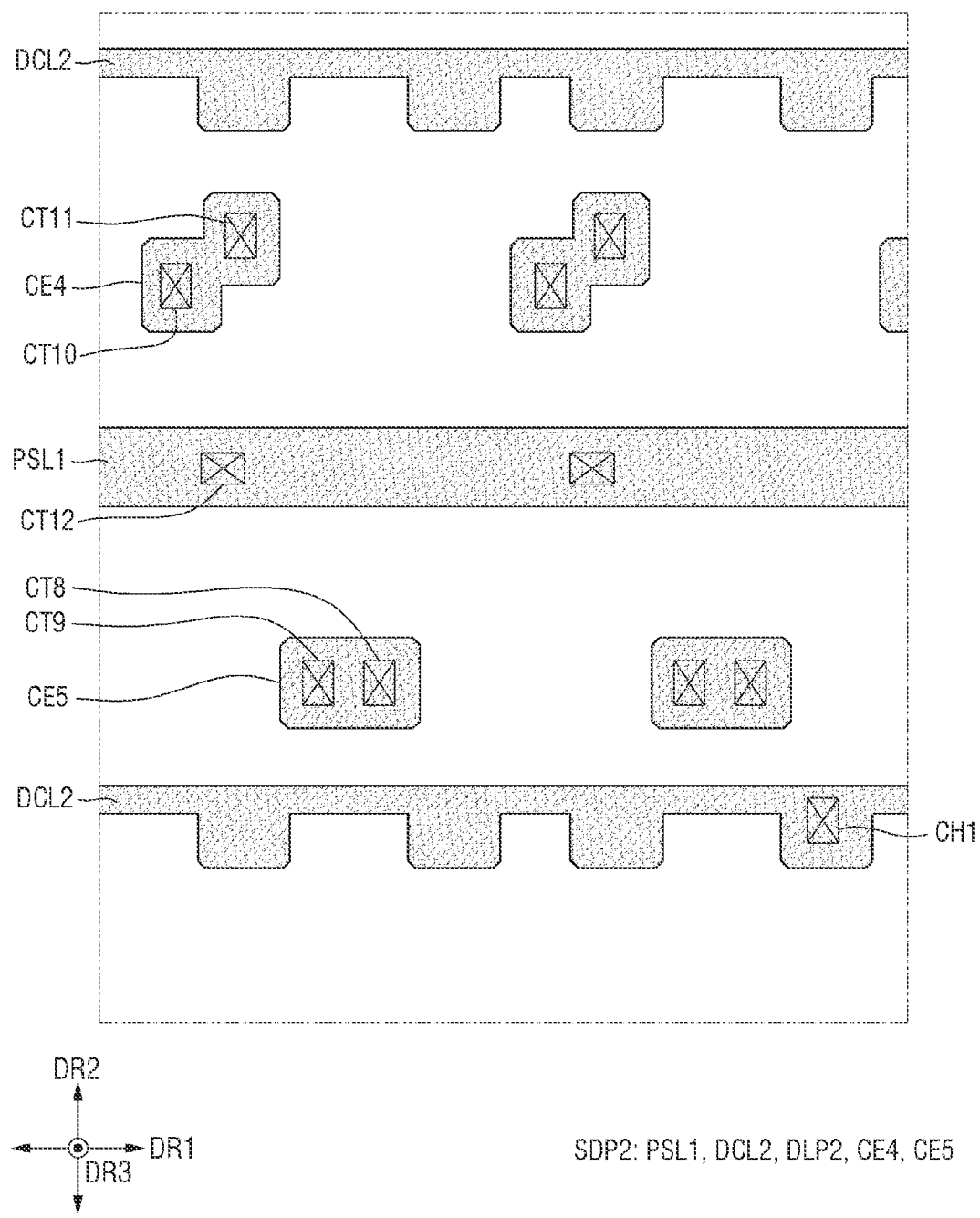
FIG. 20 illustrates the second source/drain pattern layer of FIG. 14 according to an embodiment.
Figure 21:
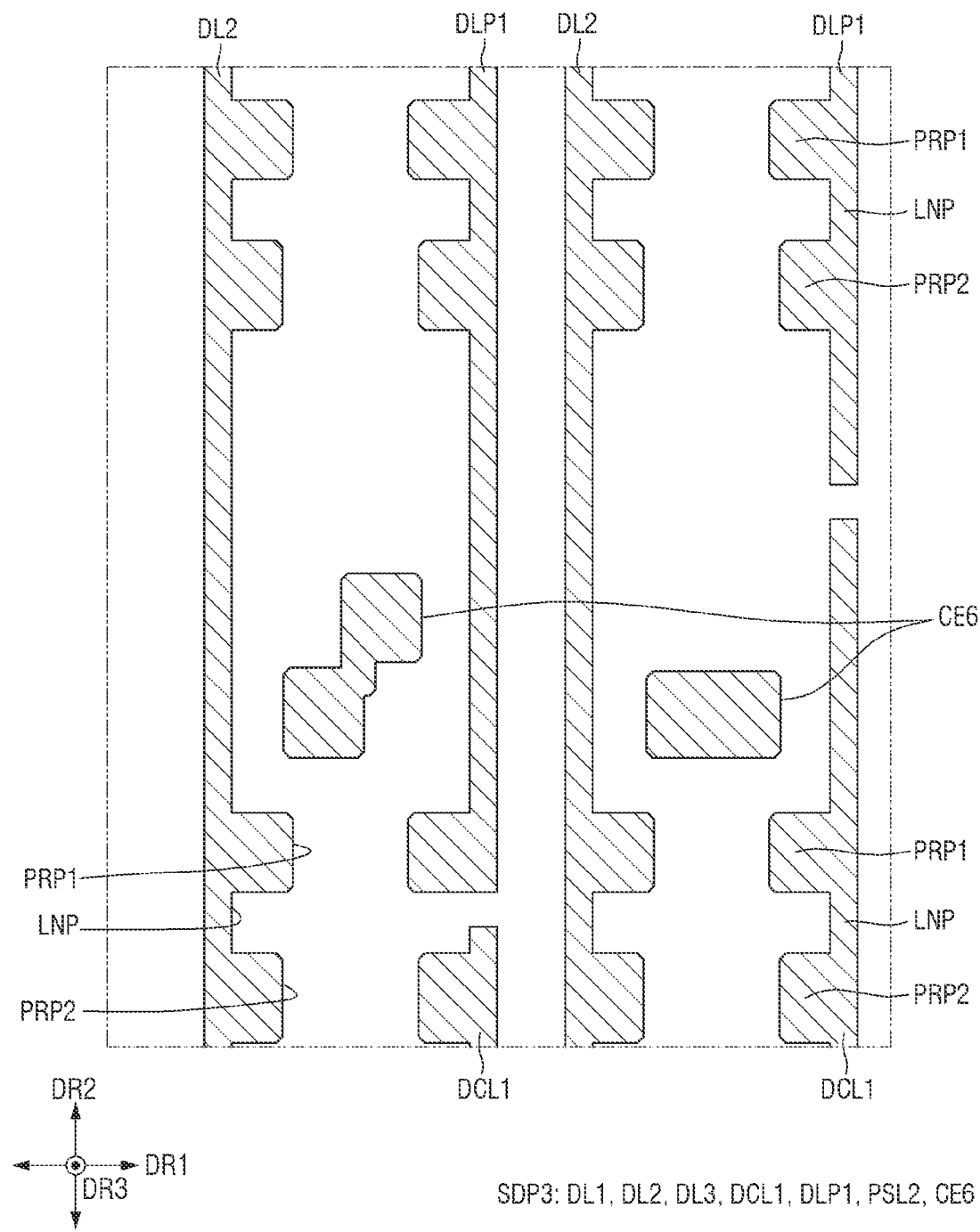
FIG. 21 illustrates the third source/drain pattern layer of FIG. 14 according to an embodiment.

FIG. 15 illustrates a cross section corresponding to line E-E' of FIGS. 13 and 14. FIG. 16 illustrates the semiconductor pattern layer of FIG. 13 according to an embodiment. FIG. 17 illustrates the first gate pattern layer of FIG. 13 according to an embodiment. FIG. 18 illustrates the second gate pattern layer of FIG. 13 according to an embodiment. FIG. 19 illustrates the first source/drain pattern layer of FIG. 13 according to an embodiment. FIG. 20 illustrates the second source/drain pattern layer of FIG. 14 according to an embodiment. FIG. 21 illustrates the third source/drain pattern layer of FIG. 14 according to an embodiment.

Referring to FIG. 15, the display panel 100 may include the thin film transistor layer TFTL disposed on the substrate SUB and including pixel driving units PDU corresponding to pixels PX.

The thin film transistor layer TFTL includes a barrier layer 110 covering the substrate SUB, the semiconductor pattern layer SEP disposed on the barrier layer 110, a first gate insulating layer 121 covering the semiconductor pattern layer SEP, the first gate pattern layer GTP1 disposed on the first gate insulating layer 121 and overlapping a portion of the semiconductor pattern layer SEP, a second gate insulating layer 122 covering the first gate pattern layer GTP1, an interlayer insulating layer 130 covering the second gate insulating layer 122, the first source/drain pattern layer SDP1 disposed on the interlayer insulating layer 130, a first planarization layer 141 covering the first source/drain pattern layer SDP1, the second source/drain pattern layer SDP2 disposed on the first planarization layer 141, a second planarization layer 142 covering the second source/drain pattern layer SDP2, the third source/drain pattern layer SDP3 disposed on the second planarization layer 142, and a third planarization layer 143 covering the third source/drain pattern layer SDP3.

The display panel 100 may further include the light emitting array layer EML disposed on the third planarization layer 143 of the thin film transistor layer TFTL, and may include the encapsulation structure layer TFEL covering the light emitting array layer EML.

The light emitting array layer EML includes light emitting elements LEL corresponding to the pixels PX.

The encapsulation structure layer TFEL covers the light emitting array layer EML.

The barrier layer 110 is to protect the thin film transistor layer TFTL and the light emitting array layer EML from moisture penetrating through the substrate SUB, and may include at least one inorganic layer.

The barrier layer 110 may include multiple layers in which inorganic layers of silicon nitride, silicon oxynitride, silicon oxide, titanium oxide, and/or aluminum oxide are stacked.

The semiconductor pattern layer SEP is disposed on the barrier layer 110 and may be formed of a silicon semiconductor such as polycrystalline silicon, single crystal silicon, low-temperature polycrystalline silicon, and amorphous silicon.

Referring to FIG. 16, the semiconductor pattern layer SEP may include channel portions CHDT, CH1-1, CH1-2, CH2, CH3-1, CH3-2, CH4, CH5, and CH6 of FIG. 13 of the driving transistor DT and each of the switch elements ST1 to ST6 provided in the pixel driving unit PDU.

The semiconductor pattern layer SEP may further include the source electrodes SDT, S1-1, S1-2, S2, S3-1, S3-2, S4, S5, and S6 of FIG. 13 and the drain electrodes DDT, D1-1, D1-2, D2, D3-1, D3-2, D4, D5, and D6 of FIG. 13 of the driving transistor DT and the switch elements ST1 to ST6.

The source electrodes SDT, S1-1, S1-2, S2, S3-1, S3-2, S4, S5, and S6 of FIG. 13 and the drain electrodes DDT, D1-1, D1-2, D2, D3-1, D3-2, D4, D5, and D6 of FIG. 13 of the driving transistor DT and the switch elements ST1 to ST6 of the semiconductor pattern layer SEP may be doped with ions or impurities to have conductivity.

The channel portions CHDT, CH1-1, CH1-2, CH2, CH3-1, CH3-2, CH4, CH5, and CH6 of FIG. 13 of the driving transistor DT and the switch elements ST1 to ST6 of the semiconductor pattern layer SEP may not be doped (by being covered by the gate electrodes GDT, G1-1, G1-2, G2, G3-1, G3-2, G4, G5, and G6), may maintain the characteristics of semiconductors, and may function as carrier movement paths depending on potential differences.

Referring to FIG. 15, the first gate insulating layer 121 may be an inorganic layer disposed on the barrier layer 110 and covering the semiconductor pattern layer SEP.

The first gate insulating layer 121 may be/include a silicon nitride layer, a silicon oxynitride layer, a silicon oxide layer, a titanium oxide layer, and/or an aluminum oxide layer.

The first gate pattern layer GTP1 is disposed on the first gate insulating layer 121.

Referring to FIG. 17, the first gate pattern layer GTP1 may include the gate electrodes GDT, G1-1, G1-2, G2, G3-1, G3-2, G4, G5, and G6 of the driving transistor DT and the switch elements ST1 to ST6 provided in the pixel driving unit PDU.

The first gate pattern layer GTP1 may further include the scan line SL, the initialization control line ICL, the gate control line GCL, and the emission control line ECL connected to the gate electrodes G1-1, G1-2, G2, G3-1, G3-2, G4, G5, and G6 of the first to sixth transistors ST1 to ST6 provided in the pixel driving unit PDU and extending in the first direction DR1.

The first gate pattern layer GTP1 may be/include a single layer or multiple layers made of a of molybdenum (Mo), aluminum (Al), chromium (Cr), gold (Au), titanium (Ti), nickel (Ni), neodymium (Nd), copper (Cu), and/or an alloy of some of the metals.

Referring to FIG. 15, the second gate insulating layer 122 may be an inorganic layer disposed on the first gate insulating layer 121 and covering the first gate pattern layer GTP1.

The second gate insulating layer 122 may be/include a silicon nitride layer, a silicon oxynitride layer, a silicon oxide layer, a titanium oxide layer, and/or an aluminum oxide layer.

The second gate pattern layer GTP2 is disposed on the second gate insulating layer 122.

Referring to FIG. 18, the second gate pattern layer GTP2 may include the shielding electrode SHE, the first power supply auxiliary line HPSL1, the gate initialization horizontal line HVGIL, and the anode initialization horizontal line HVAIL.

The second gate pattern layer GTP2 may be/include a single layer or multiple layers made of a of molybdenum (Mo), aluminum (Al), chromium (Cr), gold (Au), titanium (Ti), nickel (Ni), neodymium (Nd) and copper (Cu), and/or an alloy of some of the metals.

Referring to 15, the interlayer insulating layer 130 may be an inorganic layer disposed on the second gate insulating layer 122 and covering the second gate pattern layer GTP2.

The interlayer insulating layer 130 may be/include a silicon nitride layer, a silicon oxynitride layer, a silicon oxide layer, a titanium oxide layer, and/or an aluminum oxide layer.

The first source/drain pattern layer SDP1 is disposed on the interlayer insulating layer 130.

Referring to FIG. 19, the first source/drain pattern layer SDP1 may include the first connection electrode CE1, the second connection electrode CE2, the third connection electrode CE3, the first power supply vertical line VPSL1, the gate initialization vertical line VVGIL, and the anode initialization vertical line VVAIL.

The first source/drain pattern layer SDP1 may cover the first contact hole CT1, the second contact hole CT2, the third contact hole CT3, the fourth contact hole CT4, the fifth contact hole CTS, the sixth contact hole CT6, and a seventh contact hole CT7 passing through at least the interlayer insulating layer 130 among the interlayer insulating layer 130, the second gate insulating layer 122, and the first gate insulating layer 121.

The first contact hole CT1 is to enable connection between the first connection electrode CE1 and the gate electrode GDT of the driving transistor DT.

The first contact hole CT1 may correspond to a portion of the gate electrode GDT of the driving transistor DT and may penetrate the second gate insulating layer 122 and the interlayer insulating layer 130. The first connection electrode CE1 of the first source/drain pattern layer SDP1 may be electrically connected to the gate electrode GDT of the driving transistor DT of the first gate pattern layer GTP1 through the first contact hole CT1.

The second contact hole CT2 is to enable connection between the drain electrode D1-2 of the first-second transistor ST1-2 and the source electrode S3-1 of the third-first transistor ST3-1, and the first connection electrode CE1.

The second contact hole CT2 may correspond to a portion of the drain electrode D1-2 of the first-second transistor ST1-2 or the source electrode S3-1 of the third-first transistor ST3-1, and may penetrate the first gate insulating layer 121, the second gate insulating layer 122, and the interlayer insulating layer 130. The first connection electrode CE1 of the first source/drain pattern layer SDP1 may be electrically connected to the drain electrode D1-2 of the first-second transistor ST1-2 and the source electrode S3-1 of the third-first transistor ST3-1 of the semiconductor pattern layer SEP through the second contact hole CT2.

The gate electrode GDT of the driving transistor DT may be electrically connected to the drain electrode D1-2 of the first-second transistor ST1-2 and the source electrode S3-1 of the third-first transistor ST3-1 through the first contact hole CT1, the second contact hole CT2, and the first connection electrode CE1.

The third contact hole CT3 is to enable connection between the shielding electrode SHE and the first power supply vertical line VPSL1.

The third contact hole CT3 may correspond to a portion of the first power supply vertical line VPSL1 and may penetrate the interlayer insulating layer 130. The shielding electrode SHE of the second gate pattern layer GTP2 may be electrically connected to the first power supply vertical line VPSL1 of the first source/drain pattern layer SDP1 through the third contact hole CT3.

The fourth contact hole CT4 is to enable connection between the second connection electrode CE2 and the source electrode S2 of the second transistor ST2.

The fourth contact hole CT4 may correspond to a portion of the source electrode S2 of the second transistor ST2, and may penetrate the first gate insulating layer 121, the second gate insulating layer 122, and the interlayer insulating layer 130. The second connection electrode CE2 of the first source/drain pattern layer SDP1 may be electrically connected to the source electrode S2 of the second transistor ST2 of the semiconductor pattern layer SEP through the fourth contact hole CT4.

The fifth contact hole CT5 is to enable connection between the first power supply auxiliary line HPSL1 and the first power supply vertical line VPSL1.

The fifth contact hole CT5 may correspond to a portion of the first power supply auxiliary line HPSL1 and penetrate the interlayer insulating layer 130. The first power supply vertical line VPSL1 of the first source/drain pattern layer SDP1 may be electrically connected to the first power supply auxiliary line HPSL1 of the second gate pattern layer GTP2 through the fifth contact hole CT5.

The sixth contact hole CT6 is to enable connection between the first power supply vertical line VPSL1 and the source electrode S5 of the fifth transistor ST5.

The sixth contact hole CT6 may correspond to a portion of the source electrode S5 of the fifth transistor ST5 and penetrate the first gate insulating layer 121, the second gate insulating layer 122, and the interlayer insulating layer 130. The first power supply vertical line VPSL1 of the first source/drain pattern layer SDP1 may be electrically connected to the source electrode S5 of the fifth transistor ST5 of the semiconductor pattern layer SEP through the sixth contact hole CT6.

The seventh contact hole CT7 is to enable connection between the third connection electrode CE3 and the drain electrode D5 of the sixth transistor ST6.

The seventh contact hole CT7 may correspond to a portion of the drain electrode D5 of the sixth transistor ST6 and penetrate the first gate insulating layer 121, the second gate insulating layer 122, and the interlayer insulating layer 130. The third connection electrode CE3 of the first source/drain pattern layer SDP1 may be electrically connected to the drain electrode D5 of the sixth transistor ST6 of the semiconductor pattern layer SEP through the seventh contact hole CT7.

The first source/drain pattern layer SDP1 may be formed of a of molybdenum (Mo), aluminum (Al). chromium (Cr), gold (Au), titanium (Ti), nickel (Ni), neodymium (Nd), and/or copper (Cu).

The first source/drain pattern layer SDP1 may be provided in a Ti—Al—Ti structure in which a first metal layer ML1 made of titanium (Ti), a second metal layer ML2 made of aluminum (Al), and a third metal layer ML3 made of titanium (Ti) are stacked.

Referring to FIG. 15, the first planarization layer 141 covering the first source/drain pattern layer SDP1 may be formed of an organic material, such as acryl resin, epoxy resin, phenolic resin, polyamide resin, or polyimide resin.

The second source/drain pattern layer SDP2 is disposed on the first planarization layer 141.

Referring to FIG. 20, the second source/drain pattern layer SDP2 may include the first power supply line PSL1, the second data connection line DCL2, the second dummy line pattern DLP2 of FIGS. 8 and 12, the fourth connection electrode CE4, and the fifth connection electrode CE5.

The second source/drain pattern layer SDP2 may be/include a single layer or multiple layers made of molybdenum (Mo), aluminum (Al), chromium (Cr), gold (Au), titanium (Ti), nickel (Ni), neodymium (Nd), copper (Cu), and/or an alloy of some of the metals.

A portion of the second source/drain pattern layer SDP2 may cover the eighth contact hole CT8, the tenth contact hole CT10, and the twelfth contact hole CT12 penetrating the first planarization layer 141.

The eighth contact hole CT8 is to enable connection between the fifth connection electrode CE5 and the third connection electrode CE3.

The eighth contact hole CT8 may correspond to a portion of the third connection electrode CE3, and may penetrate the first planarization layer 141. The fifth connection electrode CE5 of the second source/drain pattern layer SDP2 may be electrically connected to the third connection electrode CE3 of the first source/drain pattern layer SDP1 through the eighth contact hole CT8.

The tenth contact hole CT10 is to enable connection between the fourth connection electrode CE4 and the second connection electrode CE2.

The tenth contact hole CT10 may correspond to a portion of the second connection electrode CE2, and may penetrate the first planarization layer 141. The fourth connection electrode CE4 of the second source/drain pattern layer SDP2 may be electrically connected to the second connection electrode CE2 of the first source/drain pattern layer SDP1 through the tenth contact hole CT10.

The twelfth contact hole CT12 is to enable connection between the first power supply line PSL1 and the first power supply vertical line VPSL1.

The twelfth contact hole CT12 may correspond to a portion of the first power supply vertical line VPSL1 and penetrate the first planarization layer 141. The first power supply line PSL1 of the second source/drain pattern layer SDP2 may be electrically connected to the first power supply vertical line VPSL1 of the first source/drain pattern layer SDP1 through the twelfth contact hole CT12.

Referring to FIG. 15, the second planarization layer 142 covering the second source/drain pattern layer SDP2 may be formed of an organic material, such as acryl resin, epoxy resin, phenolic resin, polyamide resin, or polyimide resin.

The third source/drain pattern layer SDP3 is disposed on the second planarization layer 142.

Referring to FIG. 21, the third source/drain pattern layer SDP3 may include the first data line DL1, the second data line DL2, the third data line DL3 of FIGS. 7 and 11, the first data connection line DCL1, the first dummy line pattern DLP1, the second power supply line PSL2 of FIGS. 8, 11, and 12, and the sixth connection electrode CE6.

The third source/drain pattern layer SDP3 may be/include a single layer or multiple layers made of molybdenum (Mo), aluminum (Al), chromium (Cr), gold (Au), titanium (Ti), nickel (Ni), neodymium (Nd), copper (Cu), and/or an alloy of some of the metals.

A portion of the third source/drain pattern layer SDP3 may cover the ninth contact hole CT9 and the eleventh contact hole CT11 penetrating the second planarization layer 142.

The ninth contact hole CT9 is to enable connection between the fifth connection electrode CE5 and the sixth connection electrode CE6.

The ninth contact hole CT9 may correspond to a portion of the fifth connection electrode CE5 and penetrate the second planarization layer 142. The sixth connection electrode CE6 of the third source/drain pattern layer SDP3 may be electrically connected to the fifth connection electrode CE5 of the second source/drain pattern layer SDP2 through the ninth contact hole CT9.

The eleventh contact hole CT11 is to enable connection between the first data line DL1 or the second data line DL2 and the fourth connection electrode CE4.

The eleventh contact hole CT11 may correspond to a portion of the fourth connection electrode CE4 and penetrate the second planarization layer 142. The first data line DL1 of the second data line DL2 of the third source/drain pattern layer SDP3 may be electrically connected to the fourth connection electrode CE4 of the second source/drain pattern layer SDP2 through the eleventh contact hole CT11.

Referring to FIG. 15, the third planarization layer 143 covering the third source/drain pattern layer SDP3 may be formed of an organic material, such as acryl resin, epoxy resin, phenolic resin, polyamide resin, or polyimide resin.

The light emitting array layer EML is disposed on the third planarization layer 143 of the thin film transistor layer TFTL.

The light emitting array layer EML may include anode electrodes 151 disposed on the third planarization layer 143 and corresponding to the pixels PX, may include a pixel defining layer 152 disposed on the third planarization layer 143, corresponding to the boundary between the pixels PX, and covering the edge of each of the anode electrodes 151, may include light emitting layers 153 respectively corresponding to the pixels PX and respectively disposed on the anode electrodes 151, and may include a cathode electrode 154 disposed on the pixel defining layer 152 and the light emitting layers 153 and corresponding to the pixels PX.

The anode electrode 151 of a pixel PX may be connected to the corresponding sixth connection electrode CE6 through an anode contact hole ANCT penetrating the third planarization layer 143. The anode electrode 151 may be electrically connected to the drain electrode DDT of the driving transistor DT through the seventh contact hole CT7, the third connection electrode CE3, the eighth contact hole CT8, the fifth connection electrode CE5, the ninth contact hole CT9, the sixth connection electrode CE6, and the anode contact hole ANCT.

The pixel defining layer 152 may be formed of an organic material.

The light emitting layer 153 may include an organic light emitting material.

The cathode electrode 154 may correspond to the front surface of the display area DA and may be connected to the second power line PL2 in the non-display area NDA.

The light emitting array layer EML may include the light emitting elements LEL corresponding to the pixels PX, respectively. Each of the light emitting elements LEL includes an anode electrode 151, a portion of the cathode electrode 154 opposite the anode 151, and a light emitting layer 153 interposed between the electrodes 151 and 154.

The encapsulation structure layer TFEL may cover the light emitting array layer EML and may include at least one inorganic layer and at least one organic layer. Due to the encapsulation structure layer TFEL, penetration of moisture or oxygen into the light emitting array layer EML may be prevented.

Each of FIGS. 22, 23, 24, and 25 illustrates layouts corresponding to the portion B and the portion C of FIG. 8 and an arrangement of light emitting elements according to an embodiment.

Figure 22:
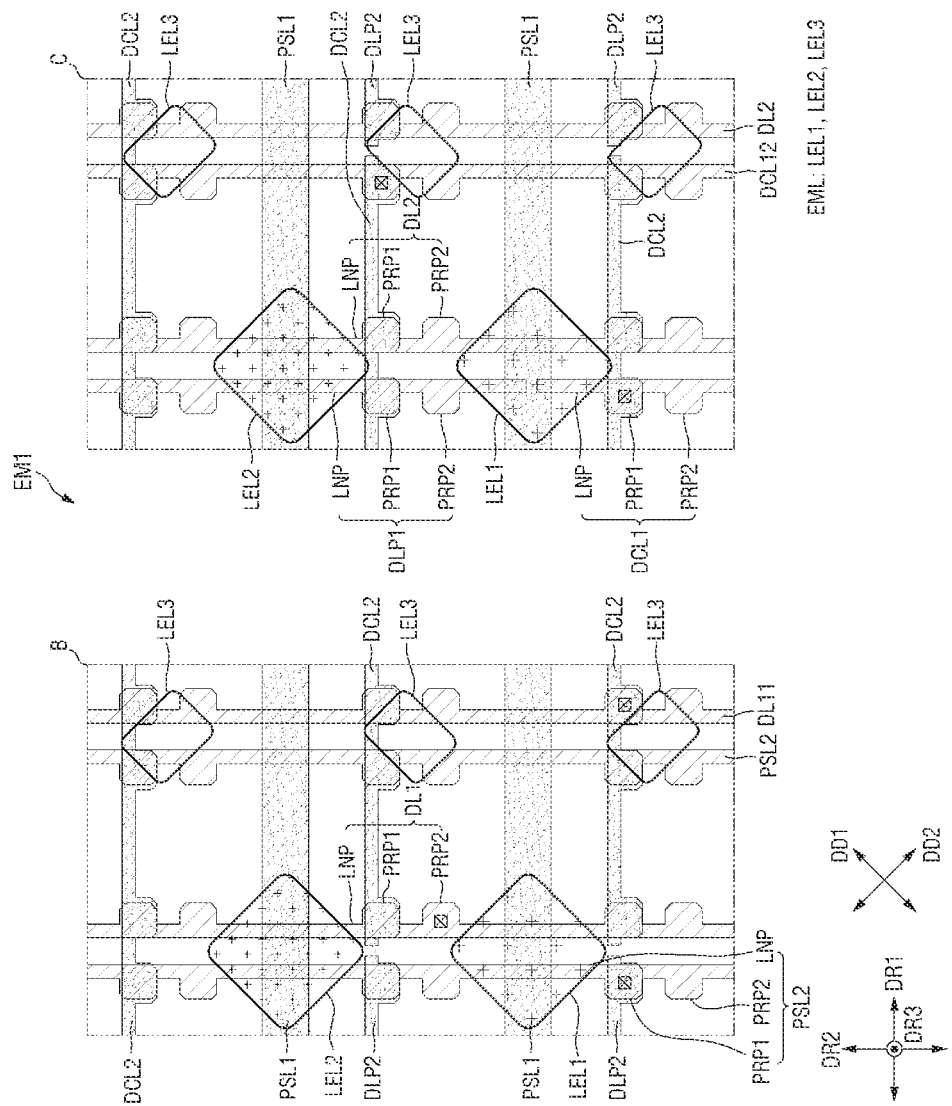

Referring to FIG. 22, a display panel EM1 is substantially the same as the display panel 100 described with reference to one or more of FIGS. 1 to 21 except that the third light emitting element LEL3 overlaps a pair of neighboring first protrusions PRP1 and a pair of neighboring second protrusions PRP2, and that the first light emitting element LEL1 and the second light emitting element LEL2 do not overlap protrusions PRP1 or PRP2.

In the display panel EM1, first light emitting elements LEL1 corresponding to first pixels and second light emitting elements LEL2 corresponding to second pixels may be alternately disposed in the first direction DR1 or in the second direction DR2, and may overlap different portions of the corresponding line pattern portion(s) LNP.

In the display panel EM1, the third light emitting element LEL3 corresponding to the third pixel may be spaced from each of the first light emitting element LEL1 and the second light emitting element LEL2 in the first diagonal direction DD1 or the second diagonal direction DD2.

Figure 23:
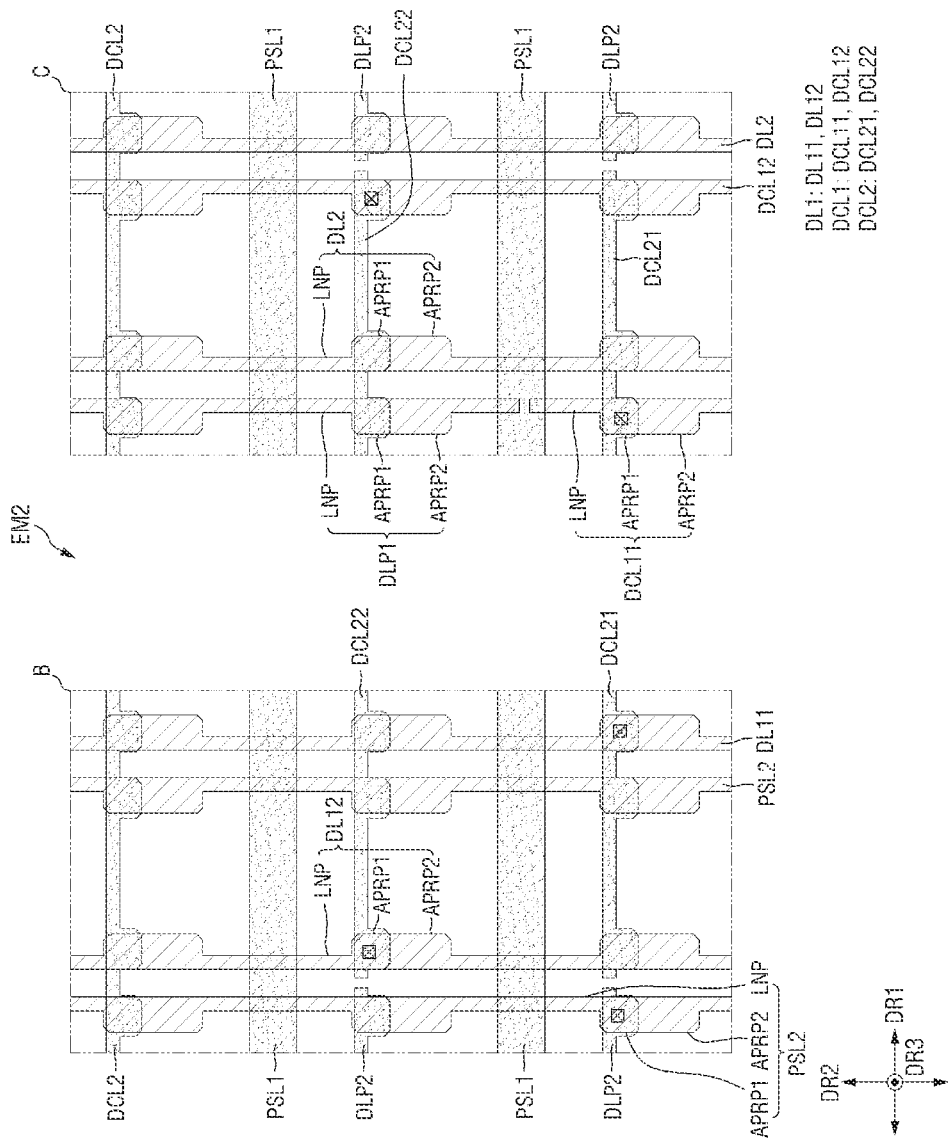

Referring to FIG. 23, a display panel EM2 is substantially the same as the display panel 100 described with reference to one or more of FIGS. 1 to 21 and/or the display panel EM1 described with reference to FIG. 22 except that a first protrusion APRP1 and a second protrusion APRP2 are integrally formed without being spaced apart.

The structures of the conductive lines are simplified, so that degradation of pattern symmetry among the conductive lines (included in the third source/drain pattern layer SDP3) may be substantially prevented.

Figure 24:
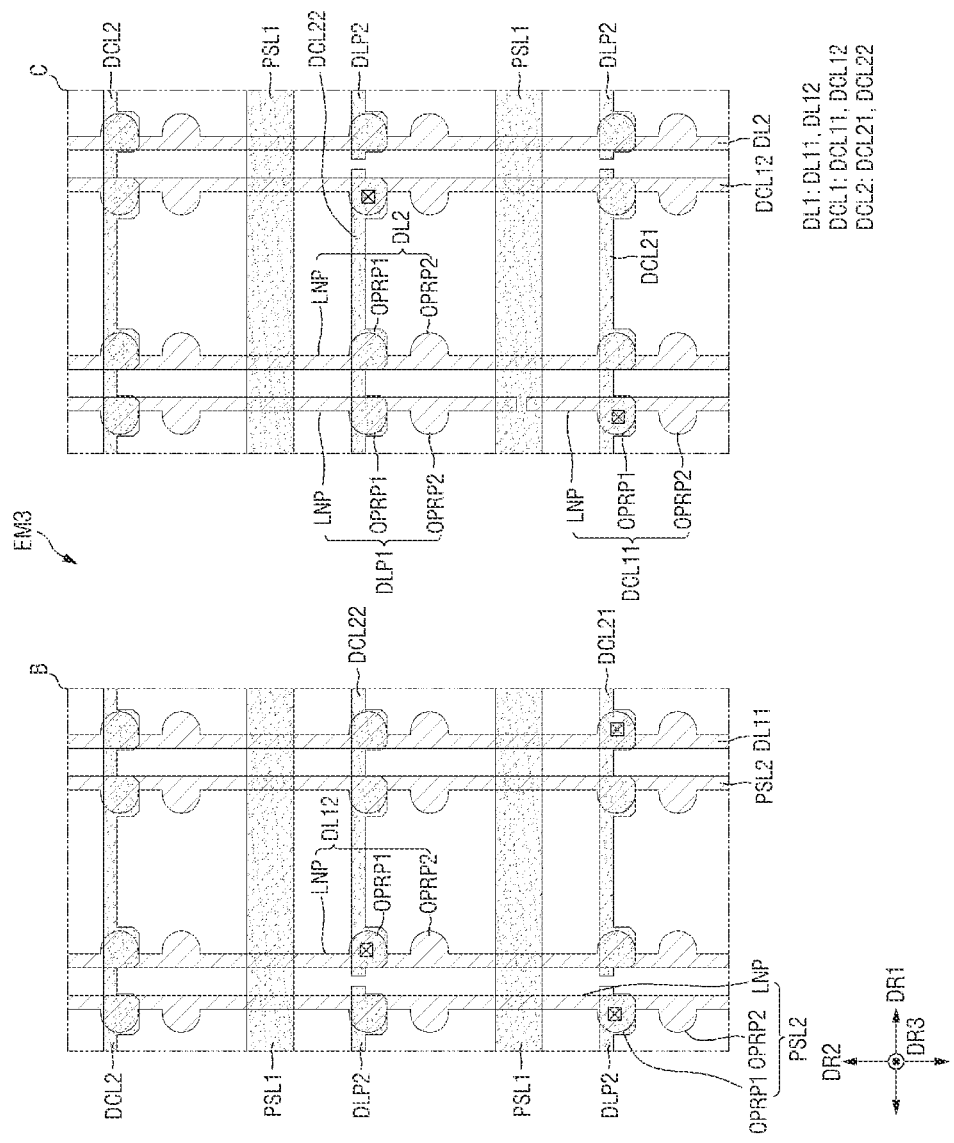

Referring to FIG. 24, a display panel EM3 is substantially the same as the display panel 100 described with reference to one or more of FIG. 1 to FIG. 21, the display panel EM1 described with reference to FIG. 22, and/or the display panel EM2 described with reference to FIG. 23 except that a first protrusion OPRP1 and a second protrusion OPRP2 each have a curved edge and/or a semicircular structure.

Figure 25:
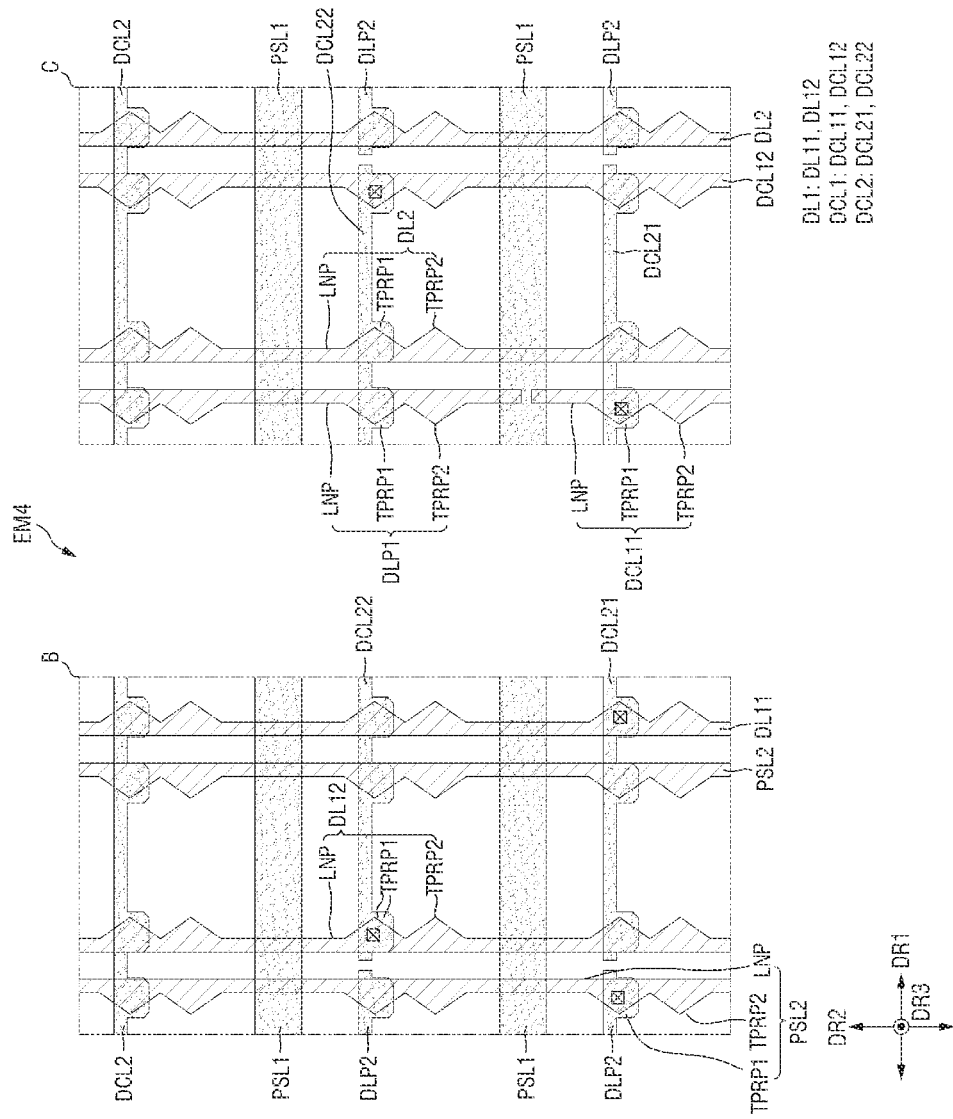
FIG. 25 illustrates layouts corresponding to the portion B and the portion C of FIG. 8 according to an embodiment.

Referring to FIG. 25, a display panel EM4 is substantially the same as the display panel 100 described with reference to one or more of FIG. 1 to FIG. 21, the display panel EMI described with reference to FIG. 22, and/or the display panel EM2 described with reference to FIG. 23 except that a first protrusion TPRP1 and a second protrusion TPRP2 each have a triangular form/structure.

Practical embodiments are not restricted to the described examples. Various embodiments are within the scope specified by the claims.

What is claimed is:

1. A display panel comprising:
a substrate including a middle area;
a first pixel overlapping the substrate;
a second pixel overlapping the substrate and disposed closer to the middle area than the first pixel in a first direction;
a first data line electrically connected to the first pixel, comprising a first line member extending in a second direction different from the first direction, and comprising a first protrusion and a second protrusion both protruding from the first line member and being wider than the first line member in the first direction;
a second data line electrically connected to the second pixel, comprising a second line member extending in the second direction, and comprising a third protrusion and a fourth protrusion both protruding from the second line member and being wider than the second line member in the first direction; and
a first data connection line electrically connected to the first data line, disposed closer to the second pixel than to the first pixel, comprising a third line member extending in the second direction, and comprising a fifth protrusion and a sixth protrusion both protruding from the third line member and being wider than the third line member in the first direction, wherein either the first protrusion and the second protrusion are overlapped with the first pixel, or the third protrusion and the fourth protrusion are overlapped with the second pixel,
wherein the first protrusion, the third protrusion, and the fifth protrusion are aligned in the first direction, and
wherein the second protrusion, the fourth protrusion, and the sixth protrusion are aligned in the first direction.

2. The display panel of claim 1, further comprising: a second data connection line extending in the first direction, and electrically connecting between the first data connection line and the first data line,
wherein the second data connection line is spaced from each of the first data line, the second data line and the first data connection line by a first insulating layer.

3. The display panel of claim 2, further comprising:
a driving circuit;
a first intermediate connection line electrically connected between the first data connection line and the driving circuit; and
a second intermediate connection line electrically connected between the second data line and the driving circuit,
wherein the first data line is electrically connected to the first intermediate connection line through the first data connection line and the second data connection line.

4. The display panel of claim 3, wherein
the first data line is electrically connected to the second data connection line through a first line contact hole overlapping with the first protrusion,
the first data line is electrically connected to the first pixel through a transistor contact hole overlapping with the second protrusion,
the first data connection line is electrically connected to the second data connection line through a second line contact hole exposing the fifth protrusion.

5. The display panel of claim 4, further comprising: a first dummy line disposed closer to the second pixel, comprising a fourth line member, and comprising a seventh protrusion and eighth protrusion both protruding from the fourth line member in the first direction, wherein the fourth line member extends in the second direction, is spaced from the third line member in the second direction, and is aligned with the third line member in the second direction.

6. The display panel of claim 5, further comprising:
a second dummy line extending in the first direction, and spaced from the second data connection line in the first direction, wherein a side of the second dummy line is aligned with a side the second data connection line in the first direction;
a first power supply line extending in the first direction, spaced from each of the second data connection line and the second dummy line in the second direction, and configured to supply a first power; and
a second power supply line disposed closer to the second pixel, comprising a fifth line member extending in the second direction, comprising a ninth protrusion and a tenth protrusion both protruding from the fifth line member in the first direction, and configured to supply a second power lower than the first power,
wherein each of the second dummy line and the first power supply line is spaced from each of the first data line, the second data line, the first data connection line and the second power supply line by the first insulating layer,
wherein the ninth protrusion is aligned with the first protrusion in the first direction, and wherein the tenth protrusion is aligned with the second protrusion in the first direction.

7. The display panel of claim 6, wherein the first protrusion is a mirror image of the ninth protrusion in a plan view of the display panel.

8. The display panel of claim 6, wherein the third protrusion is a mirror image of the fifth protrusion or the seventh protrusion in a plan view of the display panel.

9. The display panel of claim 6, further comprising:
a third pixel overlapping the middle area of the substrate;
a third data line electrically connected to the third pixel, comprising a sixth line member expending in the second direction, and comprising an eleventh protrusion and a twelfth protrusion both protruding from the sixth line member in the first direction,
wherein the second power supply line is disposed closer to the third pixel in the middle area,
wherein the eleventh protrusion is aligned with the ninth protrusion in the first direction,
wherein the twelfth protrusion is aligned with the tenth protrusion in the first direction,
wherein the eleventh protrusion is a mirror image of the ninth protrusion in a plan view of the display panel, and
wherein the twelfth protrusion is a mirror image of the tenth protrusion in a plan view of the display panel.

10. The display panel of claim 6, wherein the first dummy line is electrically connected to the second dummy line through a first power contact hole overlapped with the seventh protrusion, and wherein the second power supply line is electrically connected to the second dummy line through a second power contact hole overlapped with the ninth protrusion.

11. The display panel of claim 10, wherein some of the first protrusion, the second protrusion, the third protrusion, the fourth protrusion, the fifth protrusion, the sixth protrusion, the seventh protrusion, the eighth protrusion, the ninth protrusion, and tenth protrusion are overlapped with contact holes, and other ones of the first protrusion, the second protrusion, the third protrusion, the fourth protrusion, the fifth protrusion, the sixth protrusion, the seventh protrusion, the eighth protrusion, the ninth protrusion, and tenth protrusion are not overlapped with any contact holes.

12. The display panel of claim 11, comprising:
a semiconductor layer disposed on the substrate;
a first gate layer disposed on a first gate insulating layer covering the semiconductor layer;
a second gate layer disposed on a second gate insulating layer covering the first gate layer;
a first source/drain layer disposed on an interlayer insulating layer covering the second gate layer;
a second source/drain layer disposed on a first planarization layer covering the first source/drain layer;
a third source/drain layer disposed on a second planarization layer covering the second source/drain layer; and
a third planarization layer covering the third source/drain layer,
wherein the second source/drain layer comprises the second data connection line, the second dummy line, and the first power supply line,
wherein the third source/drain layer comprises the first data line, the second data line, the first data connection line, the first dummy line pattern, and the second power supply line, and
wherein the first insulating layer comprises the second planarization layer.

13. The display panel of claim 12, comprising:
a light emitting element of the first pixel and a light emitting element of the second pixel which are disposed on the third planarization layer; and
an encapsulation structure layer covering the light emitting element of the first pixel and the light emitting element of the second pixel.

14. The display panel of claim 6, wherein a light emitting element of the first pixel is overlapped with each of the first protrusion, the second protrusion, the ninth protrusion, and the tenth protrusion,
wherein a light emitting element of the second pixel is overlapped with the second line member, and
wherein the light emitting element of the second pixel is further overlapped with one of the third line member and the fourth line member.

15. The display panel of claim 14, wherein the first pixel is configured to emit red light or blue light, and wherein the second pixel is configured to emit green light.

16. The display panel of claim 14, wherein the first pixel is configured to emit green light, and wherein the second pixel is configured to emit red light or blue light.

17. The display panel of claim 6, wherein a light emitting element of the first pixel is overlapped with each of the first line member and the fifth line member,
wherein a light emitting element of the second pixel is overlapped with each of the third protrusion and the sixth protrusion, and
wherein the light emitting element of the second pixel is further overlapped with either the fifth protrusion and the sixth protrusion or the seventh protrusion and the eighth protrusion.

18. The display panel of claim 17, wherein the first pixel is configured to emit red light or blue light, and wherein the second pixel is configured to emit green light.

19. The display panel of claim 17, wherein the first pixel is configured to emit green light, and wherein the second pixel is configured to emit red light or blue light.

20. The display panel of claim 2, wherein the second data line is electrically connected to the second pixel through a transistor contact hole overlapped with the fourth protrusion.

* * * * *